US011372019B2

(12) United States Patent
Krueger et al.

(10) Patent No.: US 11,372,019 B2
(45) Date of Patent: Jun. 28, 2022

(54) OPTOMECHANICAL RESONATOR STABILIZATION FOR OPTOMECHANICAL DEVICES

(71) Applicant: Honeywell International Inc., Morris Plains, NJ (US)

(72) Inventors: Neil Krueger, Saint Paul, MN (US); Chad Fertig, Bloomington, MN (US); Matthew Puckett, Phoenix, AZ (US); Arthur Savchenko, Kirkland, WA (US); Steven Tin, Plymouth, MN (US); Joshua Dorr, Minneapolis, MN (US)

(73) Assignee: Honeywell International Inc., Charlotte, NC (US)

( * ) Notice: Subject to any disclaimer, the term of this patent is extended or adjusted under 35 U.S.C. 154(b) by 511 days.

(21) Appl. No.: 16/539,949

(22) Filed: Aug. 13, 2019

(65) Prior Publication Data

US 2021/0072279 A1    Mar. 11, 2021

(51) Int. Cl.
*G01P 15/093* (2006.01)
*B81B 3/00* (2006.01)
*B81B 7/02* (2006.01)

(52) U.S. Cl.
CPC .......... *G01P 15/093* (2013.01); *B81B 3/0067* (2013.01); *B81B 3/0083* (2013.01); *B81B 7/02* (2013.01); *B81B 2201/0235* (2013.01)

(58) Field of Classification Search
CPC ... G01P 15/093; B81B 3/0067; B81B 3/0083; B81B 7/02; B81B 2201/0235
See application file for complete search history.

(56) References Cited

U.S. PATENT DOCUMENTS 3,275,835 A  *  9/1966  Morrison  ................ G01P 15/13
                                               73/514.19
3,499,331 A     3/1970  Miller
                        (Continued)

FOREIGN PATENT DOCUMENTS

CN   107219378 A   9/2017
CN   108519498 A   9/2018
                (Continued)

OTHER PUBLICATIONS

Thompson et al., "Parametrically Amplified Z-Axis Lorentz Force Magnetometer," Journal of Microelectromechanical Systems, vol. 20, No. 3, Jun. 2011, 9 pp.
(Continued)

*Primary Examiner* — David J Bolduc
(74) *Attorney, Agent, or Firm* — Shumaker & Sieffert, P.A.

(57) ABSTRACT

An optomechanical device optomechanical device for stabilizing an optomechanical resonator comprising a circuit configured to generate a first optical signal and a second optical signal, modulate the first optical signal, modulate the second optical signal, and combine the first optical signal and the second optical signal into a combined optical signal to direct the combined optical signal into an assembly. An inner sidewall of a first beam structure of the assembly has a first inner spatial frequency correspond to a second inner spatial frequency of an inner sidewall of a second beam structure of the assembly and an outer sidewall of the first beam structure has a first outer spatial frequency correspond to a second outer spatial frequency of an outer sidewall of the second beam structure.

20 Claims, 18 Drawing Sheets

(56) References Cited

U.S. PATENT DOCUMENTS

| | | | |
|---|---|---|---|
| 4,233,847 A | 11/1980 | Walker | |
| 4,345,482 A | 8/1982 | Adolfsson et al. | |
| 4,422,331 A | 12/1983 | Walker | |
| 4,428,234 A | 1/1984 | Walker | |
| 4,628,175 A | 12/1986 | Nissl | |
| 4,733,561 A | 3/1988 | Gilby | |
| 4,739,660 A | 4/1988 | Fima | |
| 4,897,541 A | 1/1990 | Philips | |
| 4,900,918 A | 2/1990 | Killian | |
| 5,013,909 A | 5/1991 | Sondergeld et al. | |
| 5,109,693 A | 5/1992 | Hojo et al. | |
| 5,291,014 A | 3/1994 | Brede et al. | |
| 5,496,436 A | 3/1996 | Bernstein et al. | |
| 5,501,103 A | 3/1996 | Woodruff et al. | |
| 5,559,358 A | 9/1996 | Burns et al. | |
| 5,689,107 A | 11/1997 | Hsu | |
| 5,770,473 A | 6/1998 | Hall et al. | |
| 5,786,927 A | 7/1998 | Greywall | |
| 5,969,249 A * | 10/1999 | Roessig | G01P 15/0802 73/514.36 |
| 6,018,390 A | 1/2000 | Youmans et al. | |
| 6,182,509 B1 | 2/2001 | Leung | |
| 6,350,983 B1 | 2/2002 | Kaldor et al. | |
| 6,481,283 B1 | 11/2002 | Cardarelli | |
| 6,510,737 B1 | 1/2003 | Hobbs et al. | |
| 6,546,798 B1 | 4/2003 | Waters et al. | |
| 6,594,061 B2 | 7/2003 | Huang et al. | |
| 6,745,627 B1 | 6/2004 | Woodruff et al. | |
| 6,763,723 B1 | 7/2004 | Zook et al. | |
| 6,789,053 B2 | 9/2004 | Collins | |
| 6,807,325 B1 | 10/2004 | Kraemmer et al. | |
| 6,911,765 B2 | 6/2005 | Kawashima | |
| 6,947,642 B2 | 9/2005 | Yamazaki | |
| 6,955,085 B2 | 10/2005 | Jones et al. | |
| 7,243,542 B2 | 7/2007 | Hulsing, II | |
| 7,427,522 B2 | 9/2008 | Morikawa et al. | |
| 7,573,924 B2 | 8/2009 | Tsuda et al. | |
| 7,612,887 B2 | 11/2009 | Choi et al. | |
| 7,613,367 B2 | 11/2009 | Levy et al. | |
| 7,743,661 B2 | 6/2010 | Berthold et al. | |
| 7,808,618 B1 | 10/2010 | Tawney et al. | |
| 7,822,090 B2 | 10/2010 | Minamio et al. | |
| 7,881,565 B2 | 2/2011 | Kilic et al. | |
| 7,920,270 B2 | 4/2011 | Chow et al. | |
| 7,980,115 B2 | 7/2011 | Stewart et al. | |
| 8,159,736 B2 | 4/2012 | Maleki et al. | |
| 8,205,497 B1 * | 6/2012 | Okandan | G01C 19/5712 73/514.26 |
| 8,288,926 B2 | 10/2012 | Furuhata et al. | |
| 8,334,984 B2 | 12/2012 | Perez et al. | |
| 8,537,368 B2 | 9/2013 | Kilic et al. | |
| 8,640,542 B2 * | 2/2014 | Zhang | G01P 15/097 73/514.26 |
| 8,677,821 B2 | 3/2014 | Ayaz et al. | |
| 8,726,732 B2 | 5/2014 | Littler et al. | |
| 8,875,578 B2 | 11/2014 | Smith | |
| 8,904,867 B2 | 12/2014 | Martin et al. | |
| 8,960,002 B2 | 2/2015 | Nasir et al. | |
| 9,069,004 B2 | 6/2015 | Bhave et al. | |
| 9,194,782 B2 | 11/2015 | Jeon et al. | |
| 9,207,081 B2 | 12/2015 | Geen | |
| 9,228,916 B2 | 1/2016 | Valdevit et al. | |
| 9,239,340 B2 | 1/2016 | Hutchinson et al. | |
| 9,261,525 B2 | 2/2016 | Thiruvenkatanathan et al. | |
| 9,335,271 B2 | 5/2016 | Pruessner et al. | |
| 9,417,260 B2 | 8/2016 | Bulatowicz | |
| 9,455,354 B2 | 9/2016 | Acar | |
| 9,618,531 B2 | 4/2017 | Painter et al. | |
| 9,680,414 B1 * | 6/2017 | Chen | H03L 5/00 |
| 9,753,055 B2 | 9/2017 | Paquet et al. | |
| 9,766,099 B2 | 9/2017 | Pechstedt | |
| 9,927,458 B2 | 3/2018 | Bramhavar et al. | |
| 9,983,225 B2 | 5/2018 | Fertig et al. | |
| 10,031,158 B1 | 7/2018 | Douglas et al. | |
| 10,079,467 B2 | 9/2018 | Guzman et al. | |
| 10,107,936 B2 | 11/2018 | Compton | |
| 10,126,321 B2 | 11/2018 | Zandi et al. | |
| 10,139,564 B1 | 11/2018 | Homeijer et al. | |
| 10,705,112 B1 * | 7/2020 | Dorr | H01S 5/0085 |
| 2003/0020919 A1 * | 1/2003 | Tweedy | G01P 15/093 356/477 |
| 2004/0129867 A1 | 7/2004 | Mackey | |
| 2013/0204573 A1 | 8/2013 | Kandler | |
| 2014/0043614 A1 | 2/2014 | Dhayalan et al. | |
| 2014/0096587 A1 * | 4/2014 | Stewart | G01P 21/00 73/1.38 |
| 2014/0230520 A1 * | 8/2014 | Bulatowicz | G06F 17/10 702/96 |
| 2015/0160257 A1 * | 6/2015 | Bulatowicz | G01P 15/13 73/514.26 |
| 2016/0139170 A1 | 5/2016 | Dwyer et al. | |
| 2016/0377647 A1 | 12/2016 | Fertig et al. | |
| 2017/0057809 A1 | 3/2017 | Saint-patrice et al. | |
| 2017/0089944 A1 | 3/2017 | Duraffourg | |
| 2017/0242050 A1 | 8/2017 | Pan et al. | |
| 2018/0003749 A1 | 1/2018 | Dogiamis et al. | |
| 2018/0128850 A1 | 5/2018 | Bramhavar et al. | |
| 2018/0172723 A1 * | 6/2018 | Bramhavar | H03H 3/0073 |
| 2018/0246139 A1 | 8/2018 | Zotov et al. | |
| 2018/0267078 A1 | 9/2018 | Sato | |
| 2019/0049485 A1 | 2/2019 | Stewart et al. | |
| 2020/0309524 A1 * | 10/2020 | Fertig | G01C 19/5614 |
| 2020/0309812 A1 * | 10/2020 | Fertig | G01P 15/093 |
| 2020/0334484 A1 * | 10/2020 | Dorr | G01P 21/00 |
| 2021/0018530 A1 * | 1/2021 | Krueger | G01P 15/0802 |
| 2021/0018531 A1 * | 1/2021 | Krueger | G01P 15/0802 |
| 2021/0048447 A1 * | 2/2021 | Dorr | G01P 15/097 |
| 2021/0048448 A1 * | 2/2021 | Krueger | G01P 15/093 |

FOREIGN PATENT DOCUMENTS

| | | | |
|---|---|---|---|
| EP | 1310801 A1 | 5/2003 | |
| EP | 3112879 A1 | 1/2017 | |
| WO | 0071981 A1 | 11/2000 | |
| WO | 2008043737 A2 | 4/2008 | |
| WO | 2015/080662 A1 | 6/2015 | |
| WO | 2018197857 A1 | 11/2018 | |

OTHER PUBLICATIONS

Beyazoglu, "Integrated MEMS Cavity Optomechanical Oscillators for Wireless and Optical Communications," Electrical Engineering and Computer Sciences University of California at Berkeley, Aug. 12, 2016, 130 pp.

Chen et al., "Optical Microfiber Technology for Current, Temperature, Acceleration, Acoustic, Humidity and Ultraviolet Light Sensing," Laser Physics and Photonic Devices Laboratories, School of Engineering, University of Austrailia, sensors, MDPI, Dec. 28, 2017, 25 pp.

Chiu et al., "Development and Characterization of a CMOS-MEMS Accelerometer With Differential LC-Tank Oscillators," Journal of Microelectromechanical Systems, vol. 22, No. 6, Dec. 2013, pp. 1285-1295.

Cohen et al., "High-Q microphotonic electro-optic modulator," Department of Electrical Engineering, University of Southern California, PERGAMON, Solid-State Electronics, vol. 45, Mar. 29, 2001, 13 pp.

Gerberding et al., "Optomechanical reference accelerometer," Metrologia, vol. 52, No. 5, Apr. 2015, 13 pp.

Grutter, "Optical Whispering-Gallery Mode Resonators for Applications in Optical Communication and Frequency Control," Electrical Engineering and Computer Sciences University of California at Berkeley, Dec. 20, 2013, 127 pp.

Hutchison et al., "Z-Axis Optomechanical Accelerometer," IEEE 25th International Conference on Micro Electro Mechanical Systems (MEMS), Jan. 29 through Feb. 2, 2012, 5 pp.

Kavitha et al., "Study of squeeze film damping characteristics under different gas mediums in a capacitive MEMS accelerometer," The Brazilian Society of Mechanical Sciences and Engineering, Feb. 20, 2015, 12 pp.

(56) References Cited

OTHER PUBLICATIONS

Krause et al., "A high-resolution microchip optomechanical accelerometer," Nature Photonics, Oct. 14, 2012, 5 pp.
Krause et al., "Optical read out and feedback cooling of a nanostring optomechanical cavity," Laboratory of Applied Physics, California Institute of Technology, Jun. 3, 2015, 13 pp.
Lee et al., "Fabrication of a Micro-Opto-Mechanical Accelerometer Based on Intensity Modulation", Microsystems Technologies, vol. 10, Issue 2, Jan. 2004, 12 pp.
Li et al., "Characterization and Testing of a Micro-g Whispering Gallery Mode Optomechanical Accelerometer," Journal of Lightwave Technology, vol. 36, Issue 18, May 25, 2018, 8 pp.
Lu et al. "Optical Acceleration Measurement Method with Large Non-ambiguity Range and High Resolution via Synthetic Wavelength and Single Wavelength Superheterodyne Interferometry," MDPI, Sensors, vol. 18, Oct. 12, 2018, 11 pp.
Miao et al., "A microelectromechanically controlled cavity optomechanical sensing system," New Journal of Physics, Apr. 4, 2012, 17 pp.
Oudich et al., "Optomechanic interaction in a corrugated phoxonic nanobeam cavity," Physical Review B, Jun. 2014, 9 pp.
Pruessner et al., "Integrated waveguide-BDR microcavity optomechanical system," Optical Society of America, Optics Express, vol. 19, No. 22, Oct. 24, 2011, 15 pp.
Schliesser et al., "High-sensitivity monitoring of micromechanical vibration using optical whispering gallery mode resonators," New Journal of Physics, vol. 10, Sep. 30, 2008, 26 pp.
Sheikhaleh et al., "An Optical MEMS Accelerometer Based on a Two-Dimensional Photonic Crystal Add-Drop Filter," IEEE, Journal of Lightwave Technology, vol. 35, No. 14, Jul. 15, 2017, 6 pp.
U.S. Appl. No. 16/371,657, filed Apr. 1, 2019, by Fertig et al.
U.S. Appl. No. 16/371,762 , filed Apr. 1, 2019, by Fertig et al.
U.S. Appl. No. 16/391,074, filed Apr. 22, 2019, by Dorr et al.
U.S. Appl. No. 16/391,114 , filed Apr. 1, 2019, by Dorr et al.
U.S. Appl. No. 16/514,864, filed Jul. 17, 2019, by Krueger et al.
U.S. Appl. No. 16/514,905, filed Jul. 17, 2019, by Krueger et al.
U.S. Appl. No. 16/539,984, filed Aug. 13, 2019, by Krueger et al.
U.S. Appl. No. 16/539,974, filed Aug. 13, 2019, by Dorr et al.
Williamson et al., "Dual-Carrier Floquet Circulator with Time-Modulated Optical Resonators," Microelectronics Research Center, American Chemical Society, ACS Photonics, vol. 5, Aug. 20, 2018, 9 pp.
Yen et al., "Corrugated aluminum nitride energy harvesters for high energy conversion effectiveness," Journal of Micromechanics and Microengineering, vol. 21, No. 8, Jul. 2011, 3 pp.
Zhang et al., "A Compact Low-Power Oscillation Circuit for the High Performance Silicon Oscillating Accelerometer," AIP Conference Proceedings 1890, 040068, Oct. 5, 2017, 7 pp.
Zhang et al., "Noise suppression of a micro-grating accelerometer based on the dual modulation method," OSA Publishing, Applied Optics, vol. 56, Issue 36, Apr. 2, 2019, 4 pp.

\* cited by examiner

OPTOMECHANICAL RESONATOR STABILIZATION FOR OPTOMECHANICAL DEVICES

STATEMENT REGARDING FEDERALLY SPONSORED RESEARCH OR DEVELOPMENT

This invention was made with Government support under N66001-16-C-4018 awarded by SPAWAR Systems Center Pacific. The Government has certain rights in the invention. This material is based upon work supported by the Defense Advanced Research Projects Agency (DARPA) and Space and Naval Warfare Systems Center Pacific (SSC Pacific).

TECHNICAL FIELD

This disclosure relates to optomechanical devices, such as accelerometers configured to measure acceleration using an optical signal.

BACKGROUND

Optomechanical devices include devices for detecting acceleration, velocity, vibration, and other parameters. For example, in an optomechanical accelerometer, the resonance frequency of a mechanical structure is shifted under acceleration in the optomechanical device. The mechanical resonance frequency can be read out with an optical field by applying near-resonant light to the structure's optical resonance and measuring the transmitted or reflected optical signal.

SUMMARY

In general, the disclosure is directed to devices, systems, and techniques for resonator stabilization in optomechanical devices. As used herein, resonator stabilization may refer to locking a laser device to a very precise tuning offset (e.g., one-fourth of an optical linewidth). Fluctuations in frequency of the resonator may limit the ultimate noise floor and hence performance of the optomechanical device. For example, a circuit of an optomechanical device may be configured to include a first beam structure of an assembly having an inner sidewall that has a spatial frequency corresponding to a spatial frequency of an inner sidewall of a second beam structure and an outer sidewall having a spatial frequency corresponding to a spatial frequency of an outer sidewall of a second beam structure. In this way, the first beam structure and the second beam structure of the circuit may represent a structure with a wide optical resonance to drive mechanics of the optomechanical device and a narrow resonance to lock the laser to a very precise tuning offset.

In one example, an optomechanical device for stabilizing an optomechanical resonator includes: an assembly comprising a first beam structure and a second beam structure, wherein an inner sidewall of the first beam structure has a first inner spatial frequency corresponding to a second inner spatial frequency of an inner sidewall of the second beam structure and wherein an outer sidewall of the first beam structure has a first outer spatial frequency corresponding to a second outer spatial frequency of an outer sidewall of the second beam structure; and a circuit configured to: generate a first optical signal and a second optical signal; modulate the first optical signal, modulate the second optical signal; combine the first optical signal and the second optical signal after modulating the first optical signal and the second optical signal, wherein combining the first optical signal and the second optical signals comprises directing the first optical signal and the second optical signal into the assembly; generate a first electrical signal and a second electrical signal based on a response optical signal output from the assembly, wherein the response optical signal is generated in response to the combined optical signal; wherein, to modulate the second optical signal, the circuit is configured to modulate the second optical signal based on the second electrical signal; and wherein, to generate the first optical signal and the second optical signal, the circuit is configured to generate the first optical signal and the second optical signal to be laser locked to a frequency that is based on the first electrical signal.

In another example, a method for modulating light for stabilizing an optomechanical resonator includes: generating, by a light-emitting module, a first optical signal and a second optical signal; modulating, by a first electro-optic modulator (EOM), the first optical signal, modulating, by a second EOM, the second optical signal; combining the first optical signal and the second optical signal after modulating the first optical signal and the second optical signal, wherein combining the first optical signal and the second optical signals comprises directing the first optical signal and the second optical signal into an assembly, wherein an inner sidewall of a first beam structure of the assembly has a first inner spatial frequency corresponding to a second inner spatial frequency of an inner sidewall of a second beam structure of the assembly and wherein an outer sidewall of the first beam structure has a first outer spatial frequency corresponding to a second outer spatial frequency of an outer sidewall of the second beam structure; generating, by a polarizing beam splitter and one or more photodetectors, a first electrical signal and a second electrical signal based on a response optical signal output from the assembly, wherein the response optical signal is generated in response to the combined optical signal; wherein modulating the second optical signal is based on the second electrical signal; and wherein generating the first optical signal and the second optical signal comprises generating the first optical signal and the second optical signal to be laser locked to a frequency that is based on the first electrical signal.

In another example, an optomechanical device for stabilizing an optomechanical resonator includes a circuit configured to: generate a first optical signal and a second optical signal; modulate the first optical signal; modulate the second optical signal; combine the first optical signal and the second optical signal after modulating the first optical signal and the second optical signal, wherein combining the first optical signal and the second optical signals comprises directing the first optical signal and the second optical signal into a proof mass assembly, wherein an inner sidewall of a first beam structure of the proof mass assembly has a first inner spatial frequency corresponding to a second inner spatial frequency of an inner sidewall of a second beam structure of the proof mass assembly and wherein an outer sidewall of the first beam structure has a first outer spatial frequency corresponding to a second outer spatial frequency of an outer sidewall of the second beam structure; generate a first electrical signal and a second electrical signal based on a response optical signal output from the proof mass assembly, wherein the response optical signal is generated in response to the combined optical signal; wherein, to modulate the second optical signal, the circuit is configured to modulate the second optical signal based on the second electrical signal; and wherein, to generate the first optical signal and the second optical signal, the circuit is configured to generate the first optical signal and the second optical signal to be laser locked to a frequency that is based on the first electrical signal.

The summary is intended to provide an overview of the subject matter described in this disclosure. It is not intended to provide an exclusive or exhaustive explanation of the systems, device, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

Figure 1:
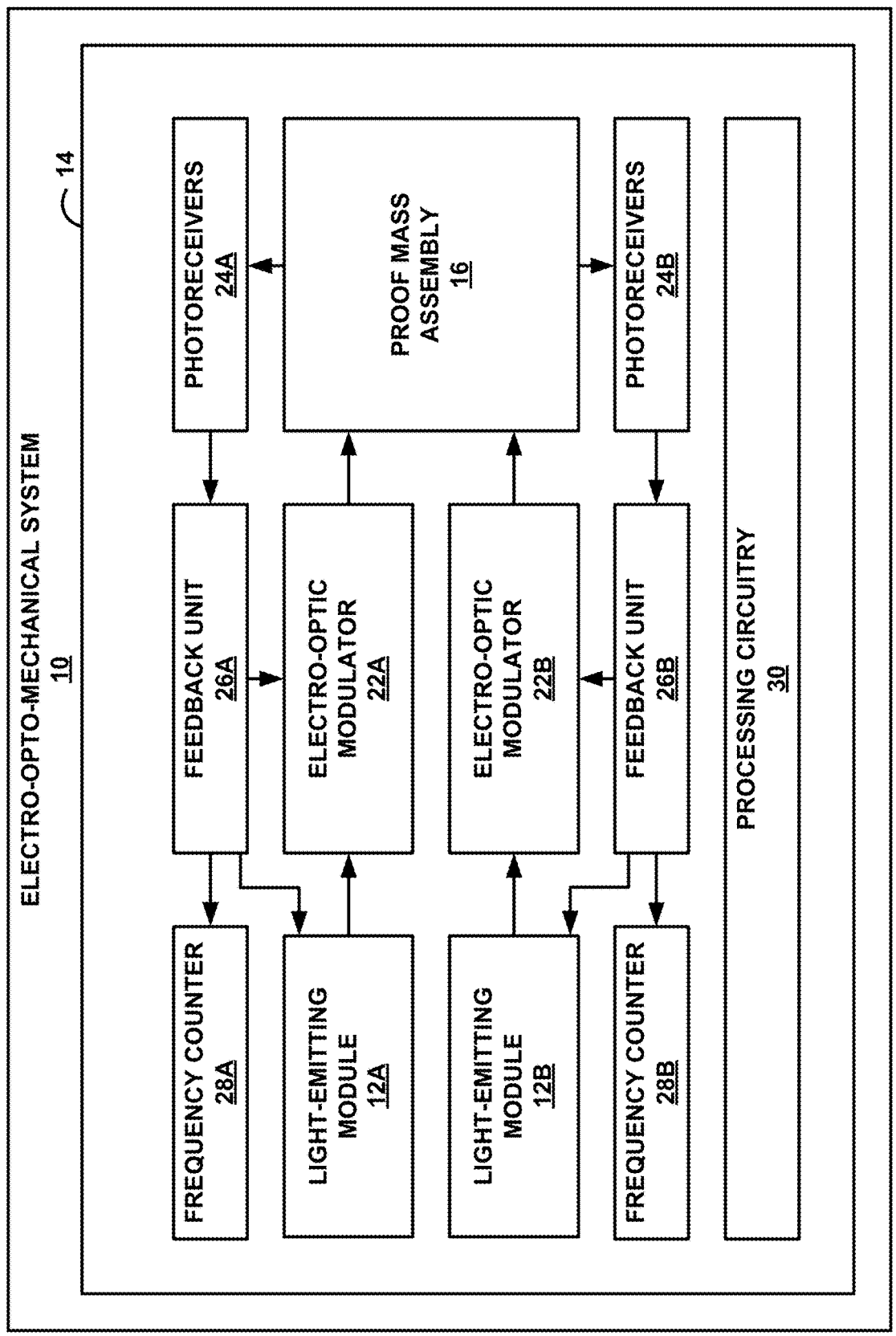
FIG. 1 is a block diagram illustrating an electro-opto-mechanical system, in accordance with one or more techniques of this disclosure.

This disclosure describes devices, systems, and techniques for resonator stabilization in optomechanical devices. For example, in an optomechanical Micro-Electro-Mechanical Systems (MEMS) accelerometer, a mechanical resonance frequency of a MEMS structure, such as, for example, but not limited to, a double-ended tuning fork structure made from nanoscale dielectric beams, is excited and probed by coupling laser light into and out of the accelerometer. In this example, the opto-mechanical coupling coefficient and the mechanical resonance frequency may be a strong function of detuning of the laser relative to the optical resonance of the accelerometer. Thus, to optimize operation, some systems may lock the wavelength of the laser to a very precise detuning offset. For instance, such systems may be configured to lock the wavelength of the laser to an optical resonance of the accelerometer that is offset by one-fourth of an optical linewidth of a Transverse Electric (TE) polarization resonance of an assembly, such as, but not limited to, for example, a proof mass assembly.

In some optomechanical accelerometer designs, an optical resonance of the accelerometer is very wide (e.g., greater than 0.1 nm) as compared to a narrow laser (e.g., less than 1 MHz), and the desired operation point call for the laser to be tuned to a smooth and featureless part of the optical resonance. However, even small errors in the operating point, which may be induced by temperature variations of the MEMS structure, can cause degraded operation in the form of increased Velocity Random Walk (VRW) noise or bias drift.

Techniques described herein may permit an opto-mechanical accelerometer with two optical resonances formed in the same structure. The opto-mechanical accelerometer may include one wide optical resonance to drive the mechanics and one narrow optical resonance with a precise wavelength offset from the wide resonance for locking the laser. These resonances may be decoupled from one another, so that the wide optical resonance and the narrow optical resonance can be independently excited. Such techniques may be used in any optomechanical devices (e.g., accelerometer) that involves optical readout of an opto-mechanical structure. Techniques described herein may reduce a noise source and may allow for enhanced stability and performance of the optomechanical device.

Specifically, for example, an optomechanical device may be designed to support optical resonances for both TE and Transverse Magnetic (TM) polarizations. For example, some systems may be configured to support optical resonances for both TE and TM polarizations using sidewall corrugation on a suspended slot waveguide in a double-ended tuning fork (DETF) structure configuration to support a proof mass assembly. In this example, an inner sidewall and outer sidewall corrugation periods may differ and may be determined by a mode index and a desired resonance position of the TM and TE polarized resonances, respectively. Such systems may be configured to use the TE polarization to drive the mechanical response of the device and the TM polarization to lock a laser frequency. The TM polarization resonance, in this example, may be made narrower than the TE polarization resonance and detuned from the TE polarization resonance a specified amount (e.g. one-fourth of the linewidth of the TE polarization resonance). Locking the laser wavelength to the TM polarization resonance may allow the detuning relative to the TE polarization resonance to be locked, which may help to mitigate TE polarization resonance shifting induced noise on the mechanical frequency drive and readout.

For example, the optomechanical device may include an electro-opto-mechanical system configured to precisely measure very high acceleration values (e.g., up to 500,000 meters per second squared ($m/s^2$)). The electro-opto-mechanical system may use a combination of electrical signals, optical signals, and mechanical signals to determine the acceleration of the object.

An optomechanical device may be configured to measure the acceleration, velocity, vibration, etc. of the object in real-time or near real-time, such that processing circuitry may analyze the acceleration, velocity, vibration, etc. of the object over a period of time to determine a positional displacement of the object during the period of time. For example, the optomechanical device may be a part of an Inertial Navigation System (INS) for tracking a position of an object based, at least in part, on an acceleration of the object. Additionally, the optomechanical device may be located on or within the object such that the optomechanical device accelerates, moves, vibrates, etc. with the object. As such, when the object accelerates, moves, vibrates, etc., the optomechanical device (including the proof mass) accelerates, moves, vibrates, etc. with the object. In some examples, because acceleration over time is a derivative of velocity over time, and velocity over time is a derivative of position over time, processing circuitry may, in some cases, be configured to determine the position displacement of the object by performing a double integral of the acceleration of the object over the period of time. Determining a position of an object using the accelerometer system located on the object—and not using on a navigation system separate from the object (e.g., a Global Positioning System (GPS))—may be referred to as "dead reckoning."

The optomechanical device may be configured to achieve high levels of sensitivity in order to improve the accuracy of the acceleration, velocity, vibration, etc. values. High sensitivity may enable the optomechanical device to detect very small acceleration, velocity, vibration, etc. values, detect a very small change in acceleration, velocity, vibration, etc. values, detect a large range of acceleration, velocity, vibration, etc. values, or any combination thereof. Additionally, an optomechanical device may be configured to accurately determine the acceleration, velocity, vibration, etc. of the object while the object is experiencing high levels of acceleration, velocity, vibration, etc. In this way, the an optomechanical device may be configured to enable an INS to accurately track the position of the object while a magnitude of the acceleration, velocity, vibration, etc. of the object is very high.

The optomechanical device may, in some examples, include a MEMS accelerometer which includes a light-emitting module, a circuit, and a proof mass assembly which includes a proof mass suspended within a frame by double-ended tuning fork (DETF) structures. In some examples, the optomechanical device may include a single-ended tuning fork or another assembly.

In some examples, the DETF structures may be configured to guide optical signals. Additionally, optical signals may induce mechanical vibration in the DETF structures. In some cases, acceleration causes a displacement of the proof mass relative to the frame, the displacement affecting mechanical vibration frequencies (e.g., mechanical resonance frequencies) corresponding to the DETF structures. In this way, a mathematical relationship may exist between acceleration and the mechanical vibration frequencies of the DETF structures. As such, the mathematical relationship may be leveraged to determine acceleration. The accelerometer device uses, in some examples, a combination of optical signals and electrical signals to measure the mechanical vibration frequencies corresponding to the DETF structures and calculate acceleration based on the mechanical vibration frequencies.

While examples of an optomechanical device are described with respect to an example accelerometer, techniques described herein for noise rejection may be applied to optomechanical device configured to measure various parameters, including, but not limited to, acceleration, velocity, vibration, and other parameters. Moreover, while examples of the optomechanical device are described with respect to an example proof mass assembly that includes a DETF structure, other structures may be used, for example, but not limited to, a single-ended tuning fork structure or another assembly.

FIG. 1 is a block diagram illustrating an electro-opto-mechanical system 10, in accordance with one or more techniques of this disclosure. FIG. 1 is merely one non-limiting example system architecture that may utilize the techniques of this disclosure for resonator stabilization. As illustrated in FIG. 1, system 10 includes light-emitting module modules 12A, 12B (collectively, "light-emitting module modules 12"), circuit 14, and proof mass assembly 16. Additionally, in the example illustrated in FIG. 1, circuit 14 includes electro-optic-modulators (EOM) 22A, 22B (collectively, "EOMs 22"), photoreceivers 24A, 24B (collectively, "photoreceivers 24"), feedback units 26A, 26B (collectively, "feedback units 26"), frequency counters 28A, 28B (collectively, "frequency counters 28"), and processing circuitry 30. While the example of FIG. 1 includes two EOMs, two photoreceivers, and two frequency counters, in some examples, an electro-opto-mechanical system may include only one EOM, one photoreceiver, and one frequency counter or more than two EOMs, two photoreceivers, and two frequency counters.

In the example of FIG. 1, light-emitting module 12A, proof mass assembly 16, EOM 22A, photoreceiver 24A, feedback unit 26A, and frequency counter 28A form a first positive feedback loop. Additionally, in the example of FIG. 1, light-emitting module 12B, proof mass assembly 16, EOM 22B, photoreceiver 24B, feedback unit 26B, and frequency counter 28B form a second positive feedback loop. In some examples, the second positive feedback loop may be omitted.

System 10 may be configured to determine an acceleration associated with an object (not illustrated in FIG. 1) based on a measured vibration frequency of a tuning fork structure of proof mass assembly. For example, system 10 may be configured to determine an acceleration associated with an object (not illustrated in FIG. 1) based on a measured vibration frequency of a set of double-ended tuning fork (DETF) structures which suspend a proof mass of proof mass assembly 16, where the vibration of the DETF structures is induced by an optical signal emitted by light-emitting module 12. In some examples, the first positive feedback loop generates a first frequency value representing a vibration frequency of a first DETF structure and the second positive feedback loop generates a second frequency value representing a vibration frequency of a second DETF structure. Based on the first vibration frequency and the second vibration frequency, system 10 may determine a first acceleration value and a second acceleration value, respectively. In some examples, system 10 determines an acceleration of an object based on the first acceleration value and the second acceleration value. In some examples, system 10 determines the acceleration of the object based on a difference of the first vibration frequency and the first vibration frequency. In some examples, system 10 determines the acceleration of the object based on only the first acceleration value (e.g., the second positive feedback loop is omitted). In some examples, system 10 determines the acceleration of the object based on only the second acceleration value (e.g., the first positive feedback loop is omitted).

Light-emitting modules 12 may each include a laser device, also referred to herein as simply "laser," configured to emit photons that form an optical signal. In some examples, light-emitting modules 12 emit the photons at an optical power within a range between 0.1 microwatts (μW) and 100 μW. In some examples, light-emitting modules 12 each include a semiconductor laser which includes a laser diode.

In some examples, circuit 14 may include a set of electrical components for processing and analyzing electrical signals received by photoreceivers 24. Components of circuit 14 are described in further detail below.

EOMs 22 may represent optical devices configured to modulate, based on electrical signals produced and processed by circuit 14, an optical signal emitted by light-emitting module 12. EOM 22A, for example, may include a set of crystals (e.g., Lithium Niobate crystals), where a refractive index of the set of crystals changes as a function of an electric field proximate to the set of crystals. The refractive index of the crystals may determine a manner in which EOM 22A modulates the optical signal. For example, the crystals of EOM 22A may receive the optical signal from light-emitting module 12 while EOM 22A is also receiving an electrical signal from feedback unit 26A of circuit 14. As such, the electrical signal may affect the electric field proximate to the crystals of EOM 22A, thus causing EOM 22A to modulate the optical signal. In some examples, EOM 22A modulates the optical signal by modulating the refractive index of the crystals using the electrical signal. EOM 22A, in some cases, may transmit the modulated optical signal to proof mass assembly 16. In some examples, EOM 22B is substantially similar to EOM 22A, with EOM 22B controlled by an electrical signal from feedback unit 26B.

Photoreceivers 24 (also referred to herein as "photodiodes") may each include one or more transistors configured to absorb photons of an optical signal and output, in response to absorbing the photons, an electrical signal. In this manner, photoreceivers 24 may be configured to convert optical signals into electrical signals. Photoreceivers 24A, for example, may include a p-n junction that converts the photons of the optical signal into the electrical signal, where the electrical signal preserves at least some parameters of the optical signal. One or more frequency values and intensity values associated with the optical signal may be reflected in the electrical signal produced by photoreceivers 24A in response to photoreceivers 24A receiving the optical signal. For example, photoreceivers 24A may produce a stronger electrical signal (e.g., greater current magnitude) in response to receiving a stronger (e.g., greater power) optical signal. Additionally, in some cases, photoreceivers 24A may produce the electrical signal to reflect the one or more frequency values corresponding to the received optical signal. In other words, processing circuitry (e.g., processing circuitry 30) may analyze the electrical signal to determine the one or more frequency values corresponding to the optical signal. Photoreceivers 24A may include semiconductor materials such as any combination of Indium Gallium Arsenide, Silicon, Silicon Carbide, Silicon Nitride, Gallium Nitride, Germanium, or Lead Sulphide. In some examples, photoreceivers 24B is substantially similar to photoreceivers 24A.

Feedback units 26 may each include a set of circuit components for processing electrical signals. In some examples, the set of circuit components included in feedback unit 26A may include any combination of a band pass filter, a phase shifter, an electronic amplifier, and a voltage limiter. Such components may process, or filter, the electrical signal such that certain aspects of the electrical signal may be more efficiently measured (e.g., frequency values or intensity values). In the example of FIG. 1, feedback unit 26A may receive an electrical signal from photoreceiver 24A and output a processed electrical signal to EOM 22A, frequency counter 28A, and light-emitting module 12A. In this way, feedback unit 26A acts as a part of a first positive feedback loop by processing an electrical signal which EOM 22A uses to modulate an optical signal emitted by light-emitting module 12A, where the modulated optical signal passes through proof mass assembly 16 before arriving back at circuit 14 for processing by feedback unit 26A.

Feedback unit 26B may be substantially similar to feedback unit 26A in that feedback unit 26B receives an electrical signal from photoreceiver 24B and delivers a processed electrical signal to frequency counter 28B, EOM 22B, and light-emitting module 12B. As such, feedback unit 26B operates within a second feedback loop in a similar manner to which feedback unit 26A operates within the first feedback loop. Again, feedback unit 26B may be omitted.

Frequency counters 28 are circuit components that are each configured for measuring a frequency of an electrical signal. For example, frequency counter 28A may determine one or more frequency values corresponding to the processed electrical signal produced by feedback unit 26A. Frequency counter 28A may measure frequency values corresponding to the processed electrical signal in real-time or near real-time, such that frequency counter 28A tracks the frequency values as a function of time. Frequency counter 28B may be substantially similar to frequency counter 28A, except frequency counter 28B receives an electrical signal from feedback unit 26B rather than from feedback unit 26A.

Processing circuitry 30, and circuit 14 generally, may include one or more processors that are configured to implement functionality and/or process instructions for execution within system 10. For example, processing circuitry 30 may be capable of processing instructions stored in a storage device (not illustrated in FIG. 1). Processing circuitry 30 may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 30 may include any suitable structure, whether in hardware, software, firmware, or any combination thereof, to perform the functions ascribed herein to processing circuitry 30. Processing circuitry 30, and circuit 14 may include only analog circuitry, only digital circuitry, or a combination of analog circuitry and digital circuitry. The term "processor" or "processing circuitry" may generally refer to any of the foregoing analog circuitry and/or digital circuitry, alone or in combination with other logic circuitry, or any other equivalent circuitry.

Proof mass assembly 16 may include a proof mass, a frame, a set of tethers, and a set of DETF structures. The proof mass, in some examples, is suspended within the frame by the set of tethers and the set of DETF structures. For example, proof mass assembly 16 may include a set of DETF structures that suspend the proof mass in a first direction relative to the frame. Additionally, the set of tethers may suspend the proof mass in a second direction and a third direction relative to the frame. The first direction, the second direction, and the third direction may represent three axes (e.g., x-axis, y-axis, and z-axis) of a Cartesian space. In some cases, the set of DETF structures enable the proof mass to be displaced in the first direction. Additionally, in some cases, the set of tethers prevent the proof mass from being displaced in the second direction and the third direction. In this way, proof mass assembly 16 may only allow the proof mass to be displaced along a single axis (e.g., a displacement axis). Because the displacement of the proof mass may determine the acceleration measured by circuit 14, system 10 may be configured to determine the acceleration relative to the displacement axis.

In some examples, the first positive feedback loop (e.g., light-emitting module 12A, proof mass assembly 16, EOM 22A, photoreceiver 24A, feedback unit 26A, and frequency counter 28A) and the second positive feedback loop (e.g., light-emitting module 12B, proof mass assembly 16, EOM 22B, photoreceiver 24B, feedback unit 26B, and frequency counter 28B) are configured to independently determine an acceleration value representative of an acceleration of an object including system 10. For example, light-emitting module 12 may emit an optical signal, EOM 22A may modulate the optical signal to obtain a first modulated optical signal, and EOM 22A may transmit the first modulated optical signal to proof mass assembly 16. Photoreceiver 24A may receive the first modulated optical signal from proof mass assembly 16, where properties of the first modulated optical signal received by photoreceiver 24A may be affected by mechanical vibrations of a first DETF structure of proof mass assembly 16. Photoreceiver 24A converts the first modulated optical signal into a first electrical signal and transmits the first electrical signal to feedback unit 26A.

Feedback unit 26A may process the first electrical signal to obtain a first processed electrical signal. For example, feedback unit 26A may use any combination of a first band pass filter, a first phase shifter, a first electronic amplifier, and a first voltage limiter to process the first electrical signal.

Frequency counter 28A may receive the first processed electrical signal and determine a first frequency value corresponding to the first processed electrical signal. In some cases, the first frequency value represents a mechanical vibration frequency of the first DETF structure of proof mass assembly 16, which carries the first modulated optical signal ultimately received by photoreceiver 24A.

In addition to transmitting the first processed electrical signal to frequency counter 28A, feedback unit 26A may transmit the first processed electrical signal to EOM 22A. In turn, EOM 22A may modulate the optical signal emitted by light-emitting module 12 based on the first processed electrical signal, where the first modulated optical signal is transmitted to photoreceiver 24A via the first DETF structure of proof mass assembly 16, thus completing the first positive feedback loop. As such, a future mechanical vibration frequency of the first DETF structure depends, at least in part, on a current mechanical vibration frequency of the first DETF structure.

Additionally, in some examples, the second positive feedback loop may determine a second frequency value. For example, light-emitting module 12 may emit an optical signal, EOM 22B may modulate the optical signal to obtain a second modulated optical signal, and EOM 22B may transmit the second modulated optical signal to proof mass assembly 16. Photoreceiver 24B may receive the second modulated optical signal from proof mass assembly 16, where properties of the second modulated optical signal received by photoreceiver 24B may be affected by mechanical vibrations of a second DETF structure of proof mass assembly 16. Photoreceiver 24B converts the second modulated optical signal into a second electrical signal and transmits the second electrical signal to feedback unit 26B.

In some examples, feedback unit 26B processes the second electrical signal to obtain a second processed electrical signal. For example, feedback unit 26B may use any combination of a second band pass filter, a second phase shifter, a second electronic amplifier, and a second voltage limiter to process the second electrical signal. Frequency counter 28B may receive the second processed electrical signal and determine a second frequency value corresponding to the second processed electrical signal. In some cases, the second frequency value represents a mechanical vibration frequency of the second DETF structure of proof mass assembly 16, which carries the second modulated optical signal ultimately received by photoreceiver 24B.

In addition to transmitting the second processed electrical signal to frequency counter 28B, feedback unit 26B may transmit the second processed electrical signal to EOM 22B. In turn, EOM 22B may modulate the optical signal emitted by light-emitting module 12 based on the second processed electrical signal, where the second modulated optical signal is transmitted to photoreceiver 24B via the second DETF structure of proof mass assembly 16, thus completing the second positive feedback loop. As such, a future mechanical vibration frequency of the second DETF structure depends, at least in part, on a current mechanical vibration frequency of the second DETF structure.

Processing circuitry 30 may be configured to calculate, based on the first frequency value, a first acceleration value. In some examples, to calculate the first acceleration value, processing circuitry 30 may subtract a baseline frequency value from the first frequency value to obtain a first frequency difference value. The baseline frequency value may represent a resonant mechanical frequency of the first DETF structure of proof mass assembly 16 while the proof mass is not displaced from a resting point along the proof mass displacement axis. In other words, the modulated optical signal emitted by EOM 22A may induce the first DETF structure to vibrate at the baseline frequency value while the proof mass is not displaced from the resting point along the proof mass displacement axis. As such, when the object is not accelerating, the first frequency difference value may be equal to zero since the first acceleration value—which represents the mechanical frequency of the first DETF structure—is equal to the baseline frequency value when the proof mass is not displaced (e.g., the object carrying system 10 is not accelerating). The first frequency difference value, in some examples, may be correlated with an acceleration of the object. In other words, an increase of a magnitude of the first frequency difference value may indicate an increase in the acceleration of the object and a decrease of a magnitude of the first frequency difference value may indicate decrease in the acceleration of the object.

Additionally, processing circuitry 30 may be configured to calculate a second acceleration value based on the second frequency value. In some examples, to calculate the second acceleration value, processing circuitry 30 may subtract a baseline frequency value from the second frequency value to obtain a second frequency difference value. The second frequency difference value, in some examples, may be correlated with an acceleration of the object. In other words, an increase of a magnitude of the second frequency difference value may indicate an increase in the acceleration of the object and a decrease of a magnitude of the second frequency difference value may indicate decrease in the acceleration of the object. The first acceleration value and the second acceleration value, which are calculated by processing circuitry 30, may, in some cases, be approximately equal.

Figure 2:
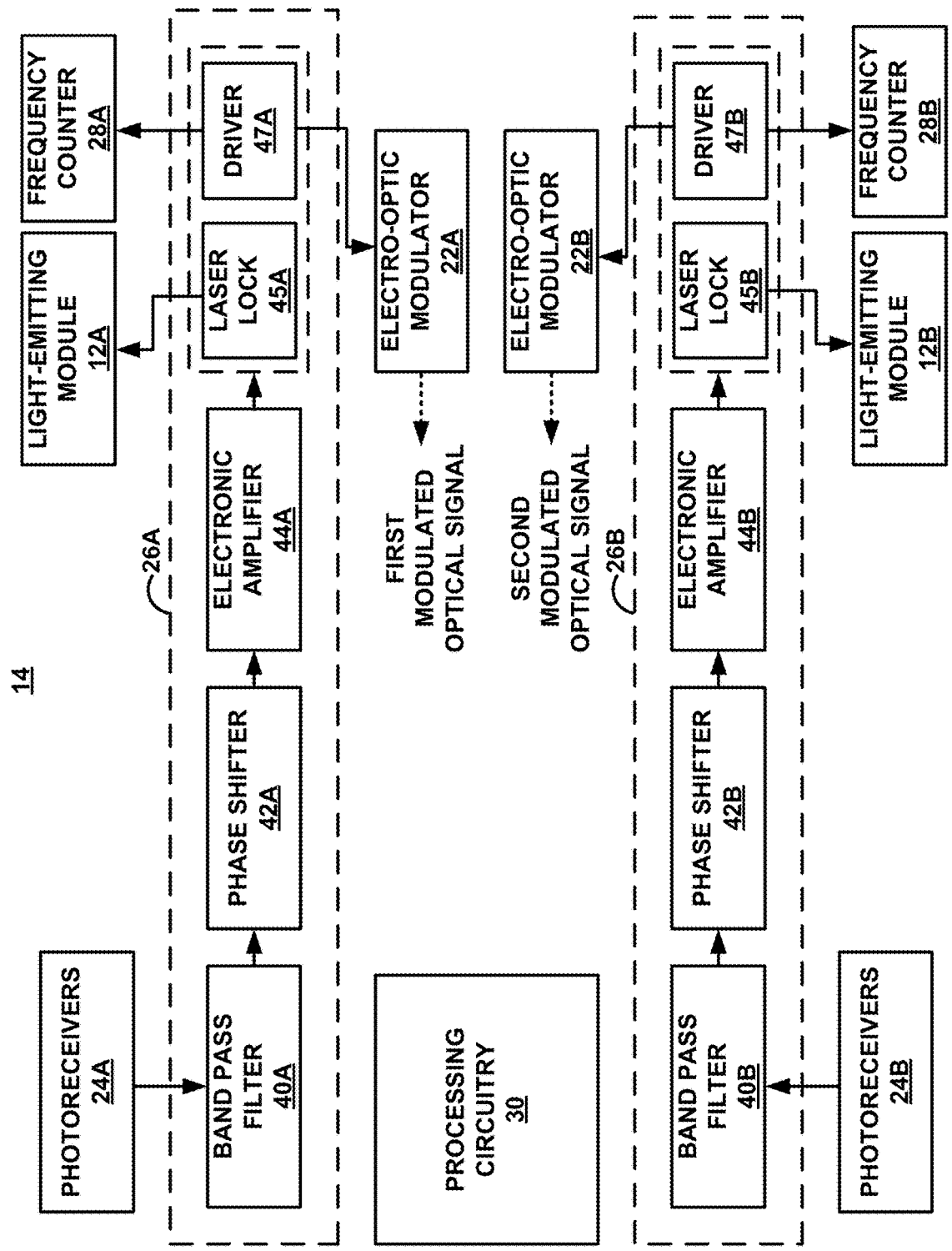
FIG. 2 is a block diagram illustrating the circuit of FIG. 1 in further detail, in accordance with one or more techniques of this disclosure.

FIG. 2 is a block diagram illustrating circuit 14 of FIG. 1 in further detail, in accordance with one or more techniques of this disclosure. As illustrated in FIG. 1, circuit 14 includes EOMs 22, photoreceivers 24, feedback units 26, frequency counters 28, and processing circuitry 30. Feedback units 26 may each include band pass filters 40A, 40B (collectively, "band pass filters 40"), phase shifters 42A, 42B (collectively, "phase shifters 42"), electronic amplifiers 44A, 44B (collectively, "electronic amplifiers 44), laser lock modules 45A, 45B (collectively, "laser lock modules 45), and drivers 47A, 47B (collectively, "drivers 47). The first feedback loop includes band pass filter 40A, phase shifter 42A, electronic amplifier 44A, laser lock module 45A, and driver 47A). The second feedback loop includes band pass filter 40B, phase shifter 42B, electronic amplifier 44B, laser lock module 45B, and driver 47B.

Circuit 14 may be configured to receive optical signals from proof mass assembly 16, convert the optical signals into electrical signals, process the electrical signals, analyze the processed electrical signals to determine acceleration values, and use the processed electrical signals to modulate optical signals and reject noise, thus completing the first feedback loop and the second feedback loop. While this example is an accelerometer, in some examples, circuit 14 may be configured to analyze the processed electrical signals to determine other values, such as, for example, but not limited to, velocity, vibration, rotation, and other values. For example, photoreceivers 24A may receive a first modulated optical signal from a first DETF structure of proof mass assembly 16. The first modulated optical signal may include a frequency component associated with the first DETF structure itself, such as a vibration frequency of the first DETF structure. Photoreceivers 24A may convert the first modulated optical signal into a first set of electrical signals, preserving the frequency component indicative of the vibration frequency of the first DETF structure for laser lock module 45A and driver 47A. Photoreceivers 24A may transmit the first set of electrical signals to feedback unit 26A, which includes band pass filter 40A, phase shifter 42A, electronic amplifier 44A, laser lock module 45A, and driver 47A.

Band pass filter 40A may be an electronic filter that attenuates frequencies outside of a frequency range and "passes" frequencies within the frequency range. In some examples, band pass filter 40A includes any combination of passive filters, active filters, infinite impulse response (IIR) filters, finite impulse response (FIR) filters, Butterworth filters, Chebyshev filters, elliptic filters, Bessel filters, Gaussian filters, Legendre filters, or Linkwitz-Riley filters. In some examples, band pass filter 40A includes a combination of a high pass filter which passes frequencies above a high pass cutoff point and a low pass filter which passes frequencies below a low pass cutoff point. In some cases, band pass filter 40A passes frequencies within a range between 100 kilohertz (kHz) and 10,000 kHz.

Phase shifter 42A may be configured to shift a phase of the first electrical signal and the second electrical signal. Phase may be characterized as a position of an instant on a waveform cycle of a periodic waveform. For example, the first electrical signal may include periodic waveforms which represent frequency components of the first electrical signal. A maximum peak of a sine wave for example, may be at a different phase than a minimum peak, or a zero crossing of the sine wave. In some examples, phase shifter 42A may "delay" the first electrical signal by a time value in order to shift a timeline in which frequency components of the first electrical signal oscillate and delay the second electrical signal by a time value in order to shift a timeline in which frequency components of the second electrical signal oscillate.

Electronic amplifier 44A may amplify the first electrical signal and/or the second electrical signal such that an amplitude of the first electrical signal is increased by a gain factor. In other words, electronic amplifier 44A may increase a power of the first electrical signal and second electrical signal. By amplifying the first electrical signal and second electrical signal using electronic amplifier 44A, circuit 14 may improve an ability of processing circuitry 30 to analyze the first electrical signal and the second electrical signal, and modulate the optical signal emitted by light-emitting module 12 using EOM 22A.

Electronic amplifier 44A may include, in some cases, power amplifiers, operational amplifiers, or transistor amplifiers, or any combination thereof. Additionally, in some examples, electronic amplifier 44A is configured to limit a voltage of the first electrical signal and/or second electrical signal to a maximum voltage value. In other words, electronic amplifier 44A may prevent the first electrical signal and the second electrical signal from exceeding the maximum voltage value, meaning that the first processed electrical signal and the second processed electrical signal produced by feedback unit 26A may not exceed the maximum voltage value.

In some examples, the first set of electrical signals may pass through feedback unit 26A in an order from band pass filter 40A, to phase shifter 42A, to electronic amplifier 44A, and to laser lock module 45A and driver 47A, as illustrated in FIG. 2. However, the order illustrated in FIG. 2 is not limiting. Band pass filter 40A, phase shifter 42A, and electronic amplifier 44A may be arranged to process the first electrical signal and second first electrical signal in any order.

Laser lock module 45A may be configured to lock a frequency of light output by light-emitting module 12A to a precise wavelength offset. For example, electro-opto-mechanical system 10 may be designed to use sidewall corrugation on a suspended slot waveguide in a DETF configuration to support a proof mass assembly that includes differing inner sidewall and outer sidewall corrugation periods. As such, laser lock module 45A may be configured to use the TM polarization resulting from the proof mass assembly to lock a laser frequency. The TM polarization resonance, in this example, may be made narrower than the TE polarization resonance and detuned from the TE polarization resonance a specified amount (e.g. one-fourth of the linewidth of the TE polarization resonance).

Driver 47A may be configured to cause EOM 22A to modulate the optical signal to drive a mechanical resonance of proof mass assembly 16. For example, driver 47A may be configured to generate a mechanical resonance feedback signal that causes EOM 22A to operate near or at the mechanical resonance of proof mass assembly 16. For example, driver 47A may generate the mechanical resonance feedback signal using a signal generator set to the mechanical resonance of proof mass assembly 16. For example, electro-opto-mechanical system 10 may be designed to use sidewall corrugation on a suspended slot waveguide in a DETF configuration to support a proof mass assembly that includes differing inner sidewall and outer sidewall corrugation periods. As such, driver 47A may be configured to use the TE polarization resulting from the proof mass assembly to drive the mechanical response of proof mass assembly 16.

Driver 47A may transmit a mechanical resonance feedback signal to frequency counter 28A. Frequency counter 28A may determine a first frequency value, and processing circuitry 30 may determine a first acceleration value based on the first frequency value. Additionally, driver 47A may transmit the mechanical resonance feedback signal to EOM 22A and EOM 22A may modulate the optical signal emitted by light-emitting module 12A based on the mechanical resonance feedback signal. In this way, proof mass assembly 16, photoreceiver 24A, band pass filter 40A, phase shifter 42A, electronic amplifier 44A, laser lock module 45A, driver 47A, EOM 22A, and frequency counter 28A are a part of the first positive feedback loop which produces the first acceleration value associated with the object including system 10.

The components of feedback unit 26B (e.g., band pass filter 40B, phase shifter 42B, electronic amplifier 44B, laser lock module 45B, and driver 47B) may be substantially similar to the respective components of feedback unit 26A. As such, the second positive feedback loop may be substantially similar to the first positive feedback loop.

Figure 3:
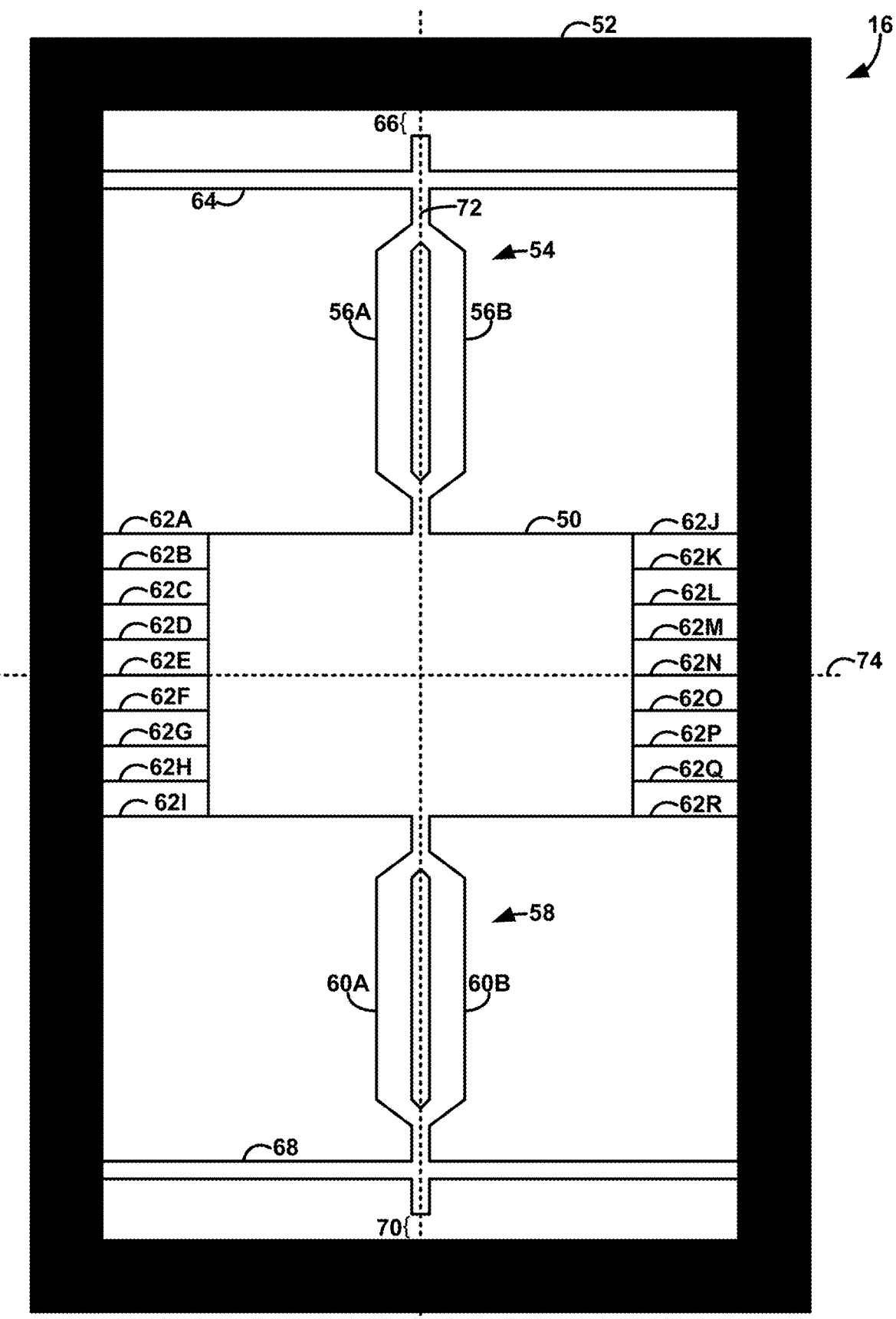
FIG. 3 illustrates a conceptual diagram of the proof mass assembly of FIG. 1 including a proof mass suspended within a frame by a first doubled ended tuning fork (DETF) structure, a second DETF structure, and a set of tethers, in accordance with one or more techniques of this disclosure.

FIG. 3 illustrates a conceptual diagram of proof mass assembly 16 including a proof mass 50 suspended within a frame 52 by a first DETF structure 54, a second DETF structure 58, and a set of tethers 62A-62R, in accordance with one or more techniques of this disclosure. As illustrated in FIG. 3, proof mass assembly 16 includes proof mass 50, frame 52, first DETF structure 54 including a first pair of mechanical beams 56A, 56B (collectively, "first pair of mechanical beams 56"), second DETF structure 58 including a second pair of mechanical beams 60A, 60B (collectively, "second pair of mechanical beams 60"), tethers 62A-62R (collectively, "tethers 62"), first distal tine 64, and second distal tine 68. Proof mass assembly 16 is aligned relative to proof mass displacement axis 72 and proof mass resting plane 74, as illustrated in FIG. 3.

Proof mass assembly 16 is a mechanical component of electro-opto-mechanical system 10. Because system 10 measures acceleration, which is a rate in which a velocity of an object changes over time, it may be beneficial to include proof mass assembly 16 so that acceleration can be measured based on a physical object such as proof mass 50. For example, system 10, which includes proof mass assembly 16 may be fixed to or included within an object. Consequently, as the object accelerates at an acceleration value, proof mass assembly 16 may also accelerate at the acceleration value. Acceleration may affect a position of proof mass 50 within frame 52 relative to proof mass displacement axis 72 and proof mass resting plane 74. For example, non-zero acceleration may cause proof mass 50 to be displaced from proof mass resting plane 74 along proof mass displacement axis 72. As described herein, if proof mass 50 is "displaced," a center of mass of proof mass 50 is displaced relative to frame 52. Increasing a magnitude of acceleration may cause the displacement of proof mass 50 along proof mass displacement axis 72 to increase. Additionally, decreasing a magnitude of acceleration may cause the displacement of proof mass 50 along proof mass displacement axis 72 to decrease.

In some examples, proof mass 50 takes the form of a patterned thin film, where the thin film has a mass within a range between 100 nanograms (ng) and 10,000 ng. Additionally, in some cases, the thin film has a thickness within a range between 1 nm and 5,000 nm. Proof mass 50 may be suspended within frame 52 along proof mass displacement axis 72 by first DETF structure 54 and second DETF structure 58 (collectively, "DETF structures 54, 58"). First DETF structure 54 and second DETF structure 58 may each have a high level of stiffness. For example, a scale factor of each of first DETF structure 54 and second DETF structure 58 may be within a range between 0.1 parts per million per gravitational force equivalent (ppm/G) and 10 ppm/G. In this way, proof mass assembly 16 may include a very light proof mass 50 which is secured by very stiff DETF structures 54, 58. As such, a very high acceleration (e.g., 100,000 m/s$^2$) may cause proof mass 50 to be displaced along the proof mass displacement axis 72 by a very small displacement value, for example. In some examples, proof mass 50 is displaced along the proof mass displacement axis 72 by a displacement value of up to 100 nm.

To generate acceleration values indicative of the acceleration of the object in which system 10 is fixed to, system 10 may quantify, using optical signals, the displacement of proof mass 50 within frame 52. To quantify the displacement of proof mass 50, system 10 may measure and analyze mechanical properties of DETF structures 54, 58, such as mechanical vibrating frequency values corresponding to DETF structures 54, 58. Indeed, since DETF structures 54, 58 suspend proof mass 50, the mechanical vibrating frequencies of DETF structures 54, 58 may be affected due to a displacement of proof mass 50. For example, a displacement of proof mass 50 towards first DETF structure 54 and away from second DETF structure 58 may cause proof mass 50 to apply a compression force to first DETF structure 54 and apply a tension force to second DETF structure 58. Such a compression force may cause the mechanical vibration frequency of first DETF structure 54 to decrease and such a tension force may cause the mechanical vibration force of second DETF structure 58 to increase. Changes in the mechanical vibration frequencies of DETF structures 54, 58 may, in some examples, be proportional to the displacement of proof mass 50 relative to frame 52 in the direction of proof mass displacement axis 72. In some examples, System 10 may measure changes in the mechanical vibration frequencies of DETF structures 54, 58 by transmitting modulated optical signals through DETF structures 54, 58.

First DETF structure 54 may include, for example, the first pair of mechanical beams 56 separated by a gap. The first pair of mechanical beams 56 may include photonic crystal mechanical beams that are configured for guiding a first modulated optical signal while first DETF structure 54 is oscillating at a first mechanical vibrating frequency. In some cases, the first modulated optical signal is emitted by light-emitting module 12 (illustrated in FIG. 1), and the first modulated optical signal itself induces vibration in first DETF structure 54. Additionally, the vibration of the first DETF structure 54 may affect certain properties of the first modulated optical signal such that the mechanical vibrating frequency of the first DETF structure 54 is reflected in the first modulated optical signal. In this way, the first modulated optical signal may cause the mechanical vibration in the first DETF structure 54 and enable system 10 to measure the mechanical vibration frequency of the first DETF structure 54 based on the first modulated optical signal.

Additionally, second DETF structure 58 may include, for example, the second pair of mechanical beams 60 separated by a gap. The second pair of mechanical beams 60 may include photonic crystal mechanical beams that are configured for guiding a second modulated optical signal while second DETF structure 58 is oscillating at a second mechanical vibrating frequency. In some cases, the second modulated optical signal is emitted by light-emitting module 12 (illustrated in FIG. 1), and the second modulated optical signal itself induces vibration in second DETF structure 58. Additionally, the vibration of the second DETF structure 58 may affect certain properties of the second modulated optical signal such that the mechanical vibrating frequency of the second DETF structure 58 is reflected in the second modulated optical signal. In this way, the second modulated optical signal may cause the mechanical vibration to occur in the second DETF structure 58 and enable system 10 to measure the mechanical vibration frequency of the second DETF structure 58 based on the second modulated optical signal.

Proof mass 50 may be fixed to frame 52 by tethers 62. In some examples, tethers 62 may suspend proof mass 50 in proof mass resting plane 74 such that the center of mass of proof mass 50 does not move within proof mass resting plane 74 relative to frame 52. Proof mass displacement axis 72 may represent a single axis (e.g., x-axis) of a Cartesian space, and proof mass resting plane 74 may represent two axes (e.g., y-axis and z-axis) of the Cartesian space. Since tethers 62 may restrict proof mass 50 from being displaced relative to proof mass resting plane 74, in some examples, proof mass 50 may only be displaced along the proof mass displacement axis 72. System 10 may measure an acceleration based on mechanical vibrating frequencies of DETF structures 54, 58, where the mechanical vibrating frequencies are related to an amount of displacement of proof mass 50 along proof mass displacement axis 72. In this way, the acceleration determined by system 10 may be an acceleration relative to proof mass displacement axis 72.

First DETF structure 54 may include a proximal end that is proximate to proof mass 50, and a distal end that is separated from frame 52 by a first gap 66. First distal tine 64 may help to suspend first DETF structure 54 within frame 52 such that the first DETF structure 54 is perpendicular to proof mass resting plane 74. In some examples, first distal tine 64 extends perpendicularly to proof mass displacement axis 72 between two sidewalls of frame 52. An optical signal may travel through frame 52 via a first optical fiber (not illustrated in FIG. 3), the optical signal being coupled across first gap 66 to first DETF structure 54.

Second DETF structure 58 may include a proximal end that is proximate to proof mass 50, and a distal end that is separated from frame 52 by a second gap 70. Second distal tine 68 may help to suspend first DETF structure 58 within frame 52 such that the second DETF structure 58 is perpendicular to proof mass resting plane 74. In some examples, second distal tine 68 extends perpendicularly to proof mass displacement axis 72 between two sidewalls of frame 52. An optical signal may travel through frame 52 via a second optical fiber (not illustrated in FIG. 3), the optical signal being coupled across second gap 70 to second DETF structure 58.

Figure 4:
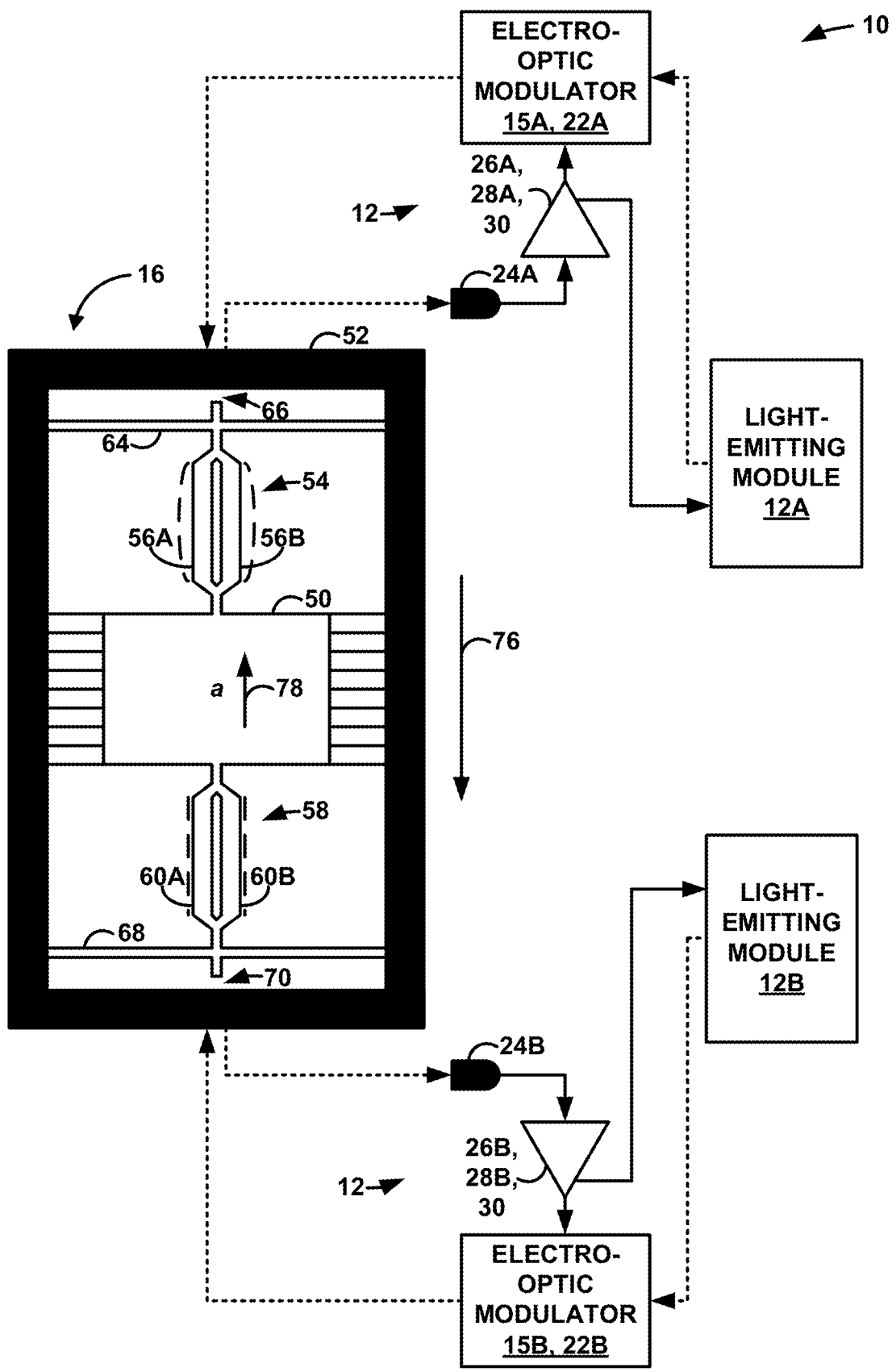
FIG. 4 illustrates a conceptual diagram of the electro-opto-mechanical system of FIG. 1, in accordance with one or more techniques of this disclosure.

FIG. 4 illustrates a conceptual diagram of system 10, in accordance with one or more techniques of this disclosure. The conceptual diagram of FIG. 4 includes light-emitting modules 12, components of circuit 14, and proof mass assembly 16. In some examples, an object may be fixed to system 10. The object, in some cases, may accelerate. System 10, including proof mass assembly 16, may accelerate with the object. As proof mass assembly 16 accelerates, proof mass 50 may be displaced relative to frame 52. In the example illustrated in FIG. 4, if proof mass assembly 16 accelerates in direction 78, proof mass 50 is displaced in direction 78. Direction 78, in some examples, is aligned with a proof mass displacement axis (e.g., proof mass displacement axis 72 of FIG. 3).

As proof mass 50 is displaced in direction 78 relative to frame 52, proof mass 50 applies a compression force to first DETF structure 54, and proof mass 50 applies a tension force to second DETF structure 58. Such forces may affect mechanical vibrating frequencies of DETF structures 54, 58, where mechanical vibration is induced in first DETF structure 54 and second DETF structure 58 by electro-optic modulator 22A and electro-optic modulator 22B, respectively. For example, the compression force applied to first DETF structure 54 may cause the mechanical vibration frequency of first DETF structure 54 to decrease, and the tension force applied to second DETF structure 58 may cause the mechanical vibration frequency of second DETF structure 58 to increase.

Light-emitting modules 12 may emit optical signals to EOMs 22. For example, light-emitting module 12A may emit an optical signal driven to a narrow resonance to lock light-emitting module 12A to a very precise tuning offset. In some examples, light-emitting module 12B may emit an optical signal driven to a narrow resonance to lock light-emitting module 12B to a very precise tuning offset.

In turn, EOM 15A, 22A and EOM 15B, 22B may modulate the optical signal according to a first processed electrical signal produced by feedback unit 26A and a second processed electrical signal produced by feedback unit 26B, respectively. For example, EOM 15A may be configured to modulate the optical signal output by light-emitting module 12A based on the TM polarization resonance of proof mass assembly 16. EOM 22A may be configured modulate the optical signal output by light-emitting module 12A based on the TE polarization resonance of proof mass assembly 16. In this way, EOM 15A, 22A may address both the narrow and wide optical resonance wavelengths.

As such, EOM 15A, 22A may produce a first modulated optical signal and EOM 15B, 22B may produce a second modulated optical signal. EOM 15A, 22A for example, may transmit the first modulated optical signal to proof mass assembly 16. The first modulated optical signal may cross frame 52. In some examples, frame 52 includes an aperture or another opening bridged by a first optical fiber which allows the first modulated optical signal to pass. Additionally, the first modulated optical signal may couple across first gap 66 to the first DETF structure 54. The first modulated optical signal may propagate through first DETF structure 54, inducing mechanical vibration in first DETF structure 54. In some examples, the first modulated optical signal propagates the length of first DETF structure 54 along mechanical beam 56A and along mechanical beam 56B. It should be understood that mechanical beam 56A and mechanical beam 56B are not individual optical channels but instead represent structures for co-propagating optical signals. By propagating the length of first DETF structure 54, the first modulated optical signal may retain information indicative of mechanical properties (e.g., the mechanical vibration frequency) of first DETF structure 54. After the first modulated optical signal propagates through first DETF structure 54, the first modulated optical signal may exit proof mass assembly 16 via first gap 66 and the first optical fiber of frame 52.

After exiting proof mass assembly 16, the first modulated optical signal, which may include fluctuations in amplitude and/or frequency (e.g., fluctuations in the mechanical resonance frequency by which the first modulated optical signal is modulated), may arrive at photoreceiver 24A. Photoreceivers 24A convert the first modulated optical signal into a set of electrical signals for rejecting noise in light-emitting module 12A and for driving EOM 22A to a mechanical resonance of proof mass assembly 16. Frequency counter 28A may determine a first frequency value corresponding to the first processed electrical signal, where the first frequency value is indicative of the mechanical vibrating frequency of the first DETF structure 54. Processing circuitry 30 may subtract a baseline frequency value from the first frequency value to obtain a first frequency difference value and calculate a first acceleration value based on the first frequency difference value. EOM 22A may use the first processed electrical signal to modulate the optical signal emitted by light-emitting module 12.

Electro-opto-mechanical system 10 may be designed to use sidewall corrugation on first DETF structure 54 and second DETF structure 58 that includes differing inner sidewall and outer sidewall corrugation periods. As such, feedback unit 26A (e.g., laser lock module 45A) may be configured to drive light-emitting module 12A to use the TM polarization resulting from the proof mass assembly to lock a frequency of an optical signal output by light-emitting module 12A. In this example, feedback unit 26A (e.g., driver 45A) may be configured to use the TE polarization resulting from the proof mass assembly to drive the mechanical response of proof mass assembly 16. In this way, feedback unit 26A may help to drive light-emitting module 12A to lock the wavelength of an optical signal to a very precise detuning offset, which may help to mitigate TE polarization resonance shifting induced noise on the mechanical frequency drive and readout.

EOM 22B, for example, may transmit the second modulated optical signal to proof mass assembly 16. The second modulated optical signal may cross frame 52. In some examples, frame 52 includes an aperture or another opening bridged by a second optical fiber which allows the second modulated optical signal to pass. Additionally, the second modulated optical signal may couple across second gap 70 to the second DETF structure 58. The second modulated optical signal may propagate through second DETF structure 58, inducing mechanical vibration in second DETF structure 58. In some examples, the second modulated optical signal propagates the length of second DETF structure 58 along mechanical beam 60A and along mechanical beam 60B. It should be understood that mechanical beam 60A and mechanical beam 60B are not individual optical channels but instead represent structures for co-propagating optical signals. By propagating the length of second DETF structure 58, the second modulated optical signal may retain information indicative of mechanical properties (e.g., the mechanical vibration frequency) of second DETF structure 58. After the second modulated optical signal propagates through second DETF structure 58, the second modulated optical signal may exit proof mass assembly 16 via second gap 70 and the second optical fiber of frame 52.

After exiting proof mass assembly 16, the second modulated optical signal, which may include thermal noise, may arrive at photoreceivers 24B. Photoreceivers 24B convert the second modulated optical signal into a set of electrical signals for rejecting noise in light-emitting module 12B and a second electrical signal for driving EOM 22B to a mechanical resonance of proof mass assembly 16. Frequency counter 28B may determine a second frequency value corresponding to the second processed electrical signal, where the second frequency value is indicative of the mechanical vibrating frequency of the second DETF structure 58. Processing circuitry 30 may subtract a baseline frequency value from the second frequency value to obtain a second frequency difference value and calculate a second acceleration value based on the second frequency difference value. EOM 22B may use the second processed electrical signal to modulate the optical signal emitted by light-emitting module 12.

Electro-opto-mechanical system 10 may be designed to use sidewall corrugation on a suspended slot to support a proof mass assembly that includes differing inner sidewall and outer sidewall corrugation periods. As such, feedback unit 26B (e.g., laser lock module 45B) may be configured to drive light-emitting module 12B to use the TM polarization resulting from the proof mass assembly to lock a frequency of an optical signal output by light-emitting module 12B. In this example, feedback unit 26B (e.g., driver 45B) may be configured to use the TE polarization resulting from the proof mass assembly to drive the mechanical response of proof mass assembly 16. In this way, feedback unit 26B may help to drive light-emitting module 12B to lock the wavelength of an optical signal to a very precise detuning offset, which may help to mitigate TE polarization resonance shifting induced noise on the mechanical frequency drive and readout.

Figure 5:
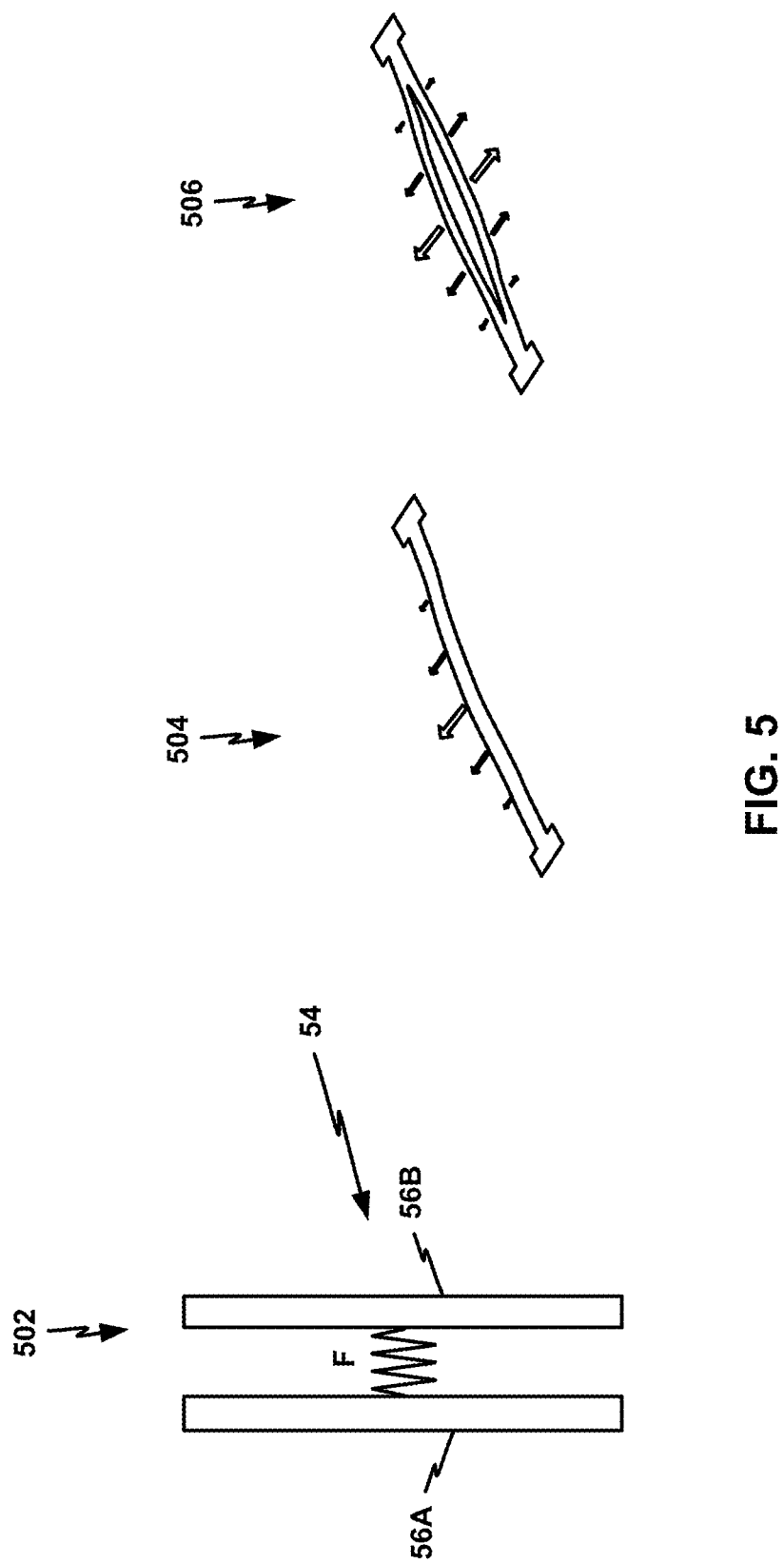
FIG. 5 depicts additional aspects of the electro-opto-mechanical system of FIG. 1, in accordance with one or more techniques of this disclosure.

FIG. 5 depicts additional aspects of system 10, in accordance with one or more techniques of this disclosure. For example, FIG. 5 illustrates the first DETF structure 54 including the first pair of mechanical beams 56. The optical signal emitted by light-emitting module 12 may induce a force between the first pair of mechanical beams 56, and the force may be modeled by a spring force. FIG. 5 illustrates a spring force provided by laser light between beams in an optical zipper in the gap between photonic crystal mechanical beams 56A, 56B of DETF structure 54 (502), a perspective view depiction of vibration modes in beams in an optical zipper in one common direction together (504), and a perspective view depiction of vibration modes in beams in an optical "zipper" in opposing directions of oscillation (506). While the examples illustrated in FIGS. 1-5 were discussed with respect to a proof mass assembly (e.g., DETF proof mass assembly), in other examples, other types of assemblies may be used.

Figure 6:
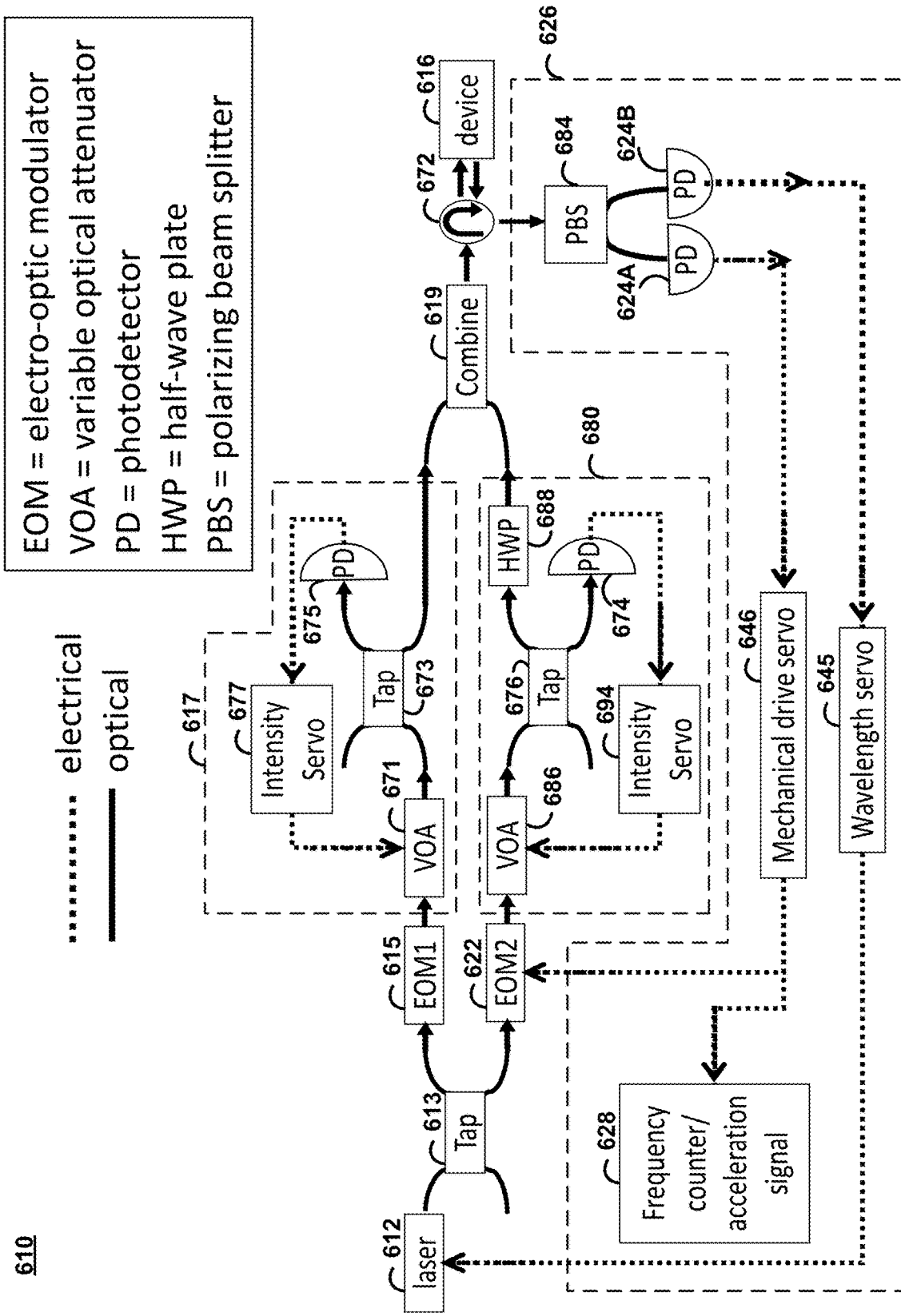
FIG. 6 is a conceptual diagram illustrating example techniques for resonator stabilization in optomechanical devices, in accordance with one or more techniques of this disclosure.

FIG. 6 is a conceptual diagram illustrating example techniques of resonator stabilization in optomechanical devices, in accordance with one or more techniques of this disclosure. FIG. 6 is discussed with reference to FIGS. 1-5 for example purposes only. As shown, electro-opto-mechanical system 610, which may be an example of system 10, may include laser device 612, tap 613, EOM 615, intensity stabilizer 617, EOM 622, intensity stabilizer 680, combiner 619, optical circulator 672, assembly 616 (also referred to herein as "device 616"), and feedback unit 626. In some examples, assembly 616 is a proof mass assembly.

Laser device 612 may be configured to produce a beam or optical signal at or near the optical resonance frequency of an optical mechanical device (e.g., a DETF structure of assembly 616 or another structure of assembly 616). In some examples, laser device 612 may be configured to generate the optical signal to be laser locked to an optical frequency offset from the TE polarization resonance of assembly 616. For example, laser device 612 may be configured to generate, using a tuning signal output by feedback unit 626, a single optical signal comprising a central carrier offset from an optical resonance of assembly 616. For instance, feedback unit 626 may drive laser device 612 to generate an optical signal comprising a central carrier offset by one-fourth of a linewidth of the TE polarization resonance (e.g., the mechanical resonance) of assembly 616.

Tap 613 may be configured to output a first portion of the optical signal output from laser device 612 to EOM 615 and a second portion of the optical signal output from laser device 612 to EOM 622. For example, tap 613 may be configured to output a half of the optical signal output from laser device 612 to EOM 615 and half of the optical signal output from laser device 612 to EOM 622.

EOM 615 may be configured to modulate the optical signal output by tap 613 to the TM polarization resonance of assembly 616. For example, EOM 615 may be configured to modulate the optical signal output by tap 613 about a peak of the TM polarization resonance of assembly 616. In this way, EOM 615 may be configured to modulate the optical signal to be detuned from the TE polarization resonance a specified amount. For example, EOM 615 may be configured to modulate the optical signal at a frequency detuned from the TE polarization resonance of assembly 616 by one-fourth of a linewidth of the TE polarization resonance.

Intensity stabilizer 617 may be configured to regulate an intensity of the optical signal output by EOM 615 to regulate an intensity of the optical signal to a predetermined light intensity value. For example, the filtered optical signal passes through a Variable Optical Attenuator (VOA) 671, which may be configured to attenuate a portion of the optical signal. Tap 673 may be configured to output a first portion of the optical signal output from VOA 671 to photodiode 675 and a second portion of the optical signal output from VOA 671 to combiner 619. In this example, photodiode 675 may be configured to stabilize the overall light level of the optical signal.

EOM 622 may be configured to modulate the optical signal output by tap 613 to interact (e.g., by modulating the optical signal at the frequency of the mechanical resonance to enhance the driving of the mechanical response by the optical signal) with the TE polarization resonance of assembly 616. For example, EOM 622 may be configured to modulate the optical signal output by tap 613 about a peak of the TE polarization resonance of assembly 616 or detuned from the peak of the TE polarization resonance of assembly 616. In some examples, EOM 622 may be configured to modulate the optical signal output by tap 613 at a frequency corresponding to a mechanical resonance of assembly 616. In this way, EOM 622 may be configured to use the TE polarization to drive the mechanical response of assembly 616.

Intensity stabilizer 680 may be configured to regulate an intensity of the optical signal output by EOM 622 to regulate an intensity of the optical signal to a predetermined light intensity value. For example, the filtered optical signal passes through a VOA 686, which may be configured to attenuate a portion of the optical signal. Tap 676 may be configured to output a first portion of the optical signal output from VOA 686 to photodiode 674 and a second portion of the optical signal output from VOA 686 to combiner 619. In this example, photodiode 674 may be configured to stabilize the overall light level of the optical signal.

In the example of FIG. 6, intensity stabilizer 680 includes half-wave plate (HWP) 688. However, in some examples, HWP 688 may be arranged outside of intensity stabilizer 680. For example, HWP 688 may be placed after tap 613 or after EOM 622. HWP 688 may be configured to rotate a polarization of an optical signal output by tap 676 by 90 degrees (e.g., $\pi/2$). In this way, HWP 688 may be configured to ensure that an optical signal output by tap 673, which may represent a TM polarization resonance, and an optical signal output by HWP 688, which may represent a TE polarization resonance are in a proper polarization state (e.g., an orthogonal polarization state) to address both the TE and TM polarization resonances.

Combiner 619 may be configured to combine an optical signal output by tap 673 and an optical signal output by HWP 688. For example, combiner 619 may include a Y-coupler configured to combine the optical signal output by tap 673 and the optical signal output by HWP 688.

Assembly 616 may be configured with a dual structure (e.g., nano-beam structure) that includes a first beam structure and a second beam structure that receives an optical signal from circulator 672 and outputs a TE-polarized optical signal at the TE-polarized optical resonance of assembly 616 to drive the mechanical response of assembly 616 and a TM polarization to lock a laser frequency of laser device 612. For example, assembly 616 may be configured such that an inner sidewall of the first beam structure has a spatial frequency corresponding to a spatial frequency of an inner sidewall of the second beam structure and such that an outer sidewall of the first beam structure has a spatial frequency corresponding to a spatial frequency of an outer sidewall of the second beam structure.

Optical circulator 672 may be configured to output an optical signal output by combiner 619 to assembly 616 and receive an optical signal reflected from assembly 616. For example, the optical signal passes into port '1' of optical circulator 672 and out of port '2' of optical circulator 672, where the modulated optical signal interacts with assembly 616 (e.g., a zipper cavity measured in reflection).

After reflection back into port '2' of optical circulator 672, the optical signal is output from port '3' of optical circulator 672 to feedback unit 626. Feedback unit 626 may be configured to drive laser device 612 to use a TM polarization resulting from assembly 616 to lock a frequency of an optical signal output by light-emitting module 612. In this example, feedback unit 626 may be configured to use the TE polarization resulting from assembly 616 to drive the mechanical response of assembly 616. In this way, feedback unit 626 may help to drive laser device 612 to lock the wavelength of an optical signal to a very precise detuning offset, which may help to mitigate TE polarization resonance shifting induced noise on the mechanical frequency drive and readout.

As shown, feedback unit 626 may include polarizing beam splitter 684 ("PBS 684"), photodiodes 624A, 624B (collectively, "photodiodes 624"), mechanical drive servo 646, frequency counter and acceleration signal module 628, and wavelength servo 645. Mechanical drive servo 646 may be an example of drivers 47A, 47B, wavelength servo 645 may be an example of laser lock module 45A, 45B, frequency counter and acceleration signal module 628 may be an example of frequency counter 28A, 28B.

PBS 684 may be configured to split the optical signal output by circulator 672 into a first portion of the optical signal output by circulator 672 and a second portion of the optical signal output by circulator 672. For instance, PBS 684 may be configured to split the optical signal output by circulator 672 such that the first portion of the optical signal is polarized for a TM polarization resonance of assembly 616 and the second portion of the optical signal is polarized for a TE polarization resonance of assembly 616. Photodiode 624A may be configured to convert the first portion of the optical signal output by PBS 684 into a first electrical signal. Similarly, photodiode 624B may be configured to convert the second portion of the optical signal output by PBS 684 into a second electrical signal.

Mechanical drive servo 646 may be configured to cause EOM 622 to drive the optical signal output by tap 613 to a mechanical resonance of assembly 616. For example, mechanical drive servo 646 may be configured to generate a mechanical resonance feedback signal that causes EOM 622 to operate near or at the mechanical resonance of assembly 616. For example, mechanical drive servo 646 may generate a mechanical resonance feedback signal using a signal generator set to the mechanical resonance of assembly 616. Mechanical drive servo 646 may transmit a mechanical resonance feedback signal to frequency counter and acceleration signal module 628. Frequency counter and acceleration signal module 628 may determine a first frequency value to determine an acceleration value for assembly 616. Frequency counter and acceleration signal module 628 may be configured to measure, using the mechanical resonance feedback signal, an acceleration of assembly 616.

Wavelength servo 645 may be configured to lock a frequency of light output by laser device 612 to a precise wavelength offset. Wavelength servo 645 may be configured to use the indication of the TM polarization resonance output by photodiode 624B. The TM polarization resonance, in this example, may be made narrower than the TE polarization resonance and detuned from the TE polarization resonance a specified amount (e.g. one-fourth of the linewidth of the TE polarization resonance).

In accordance with techniques described herein, laser device 612 emits an optical signal (e.g., light) at a TM polarization resonance wavelength. Tap 613 splits the optical signal output by laser device 612 and outputs a first optical signal to EOM 615 and a second optical signal to EOM 622. EOM 615 may be configured to generate a laser lock signal. EOM 622 may be configured to generate a mechanical drive signal. EOM 615 outputs an optical signal to intensity stabilizer 617 and EOM 622 outputs an optical signal to intensity stabilizer 680. After intensity stabilization, HWP 688 rotates a polarization of an optical signal by 90 degrees. Combiner 619 combines an optical signal output by intensity stabilizer 617 and an optical signal output by intensity stabilizer 680. The two optical channels output by intensity stabilizers 617, 680 and combined by combiner 619, with their polarizations perpendicular, pass through assembly 616 and circulator 672 to assembly 616. The reflected optical signal goes back into circulator 672 and circulator 672 re-directs the reflected optical signal to PBS 684. PBS 684 splits the reflected optical signal into a TM-polarized optical signal for output to photodiode 624B and a TE-polarized optical signal for output to photodiode 624A.

Wavelength servo 645 receives an electrical signal indicating a TM polarized signal from photodiode 624B and generates an electrical feedback to control laser device 612. For example, wavelength servo 645 may be configured to determine a peak of a TM polarization resonance of assembly 616. In this example, wavelength servo 645 may be configured to drive laser device 612 to a frequency corresponding (e.g., equal to, matching, etc.) to the peak of the TM polarization resonance of assembly 616.

Mechanical drive servo 646 receives an electrical signal indicating a TE polarized signal from photodiode 624A and generates an electrical feedback signal for output to EOM 622 and to frequency counter and acceleration signal module 628. For example, mechanical drive servo 646 may be configured to identify and generate a feedback signal based on mechanically-induced modulation of the TE-polarized optical signal interacting with assembly 616.

Mechanical drive servo 646 may be configured to perform a frequency counting operation in the electrical domain, which directly indicates the acceleration-sensitive mechanical frequency of the optomechanical structure/architecture and, consequently, the acceleration experienced by assembly 616. With the dual-polarization (e.g., TE polarization resonance and TM polarization resonance) operation described above, reduced acceleration sensing noise is expected due to an improved ability to lock the mechanical drive laser detuning to the optomechanical cavity of assembly 616, as all sources as TE and TM polarization resonance shifting are common-mode, especially when the optical signals originate from a single laser (e.g., laser device 612) and are in very close spatial proximity during the optical signals interaction with the optomechanical accel device (e.g., assembly 616).

Figure 7:
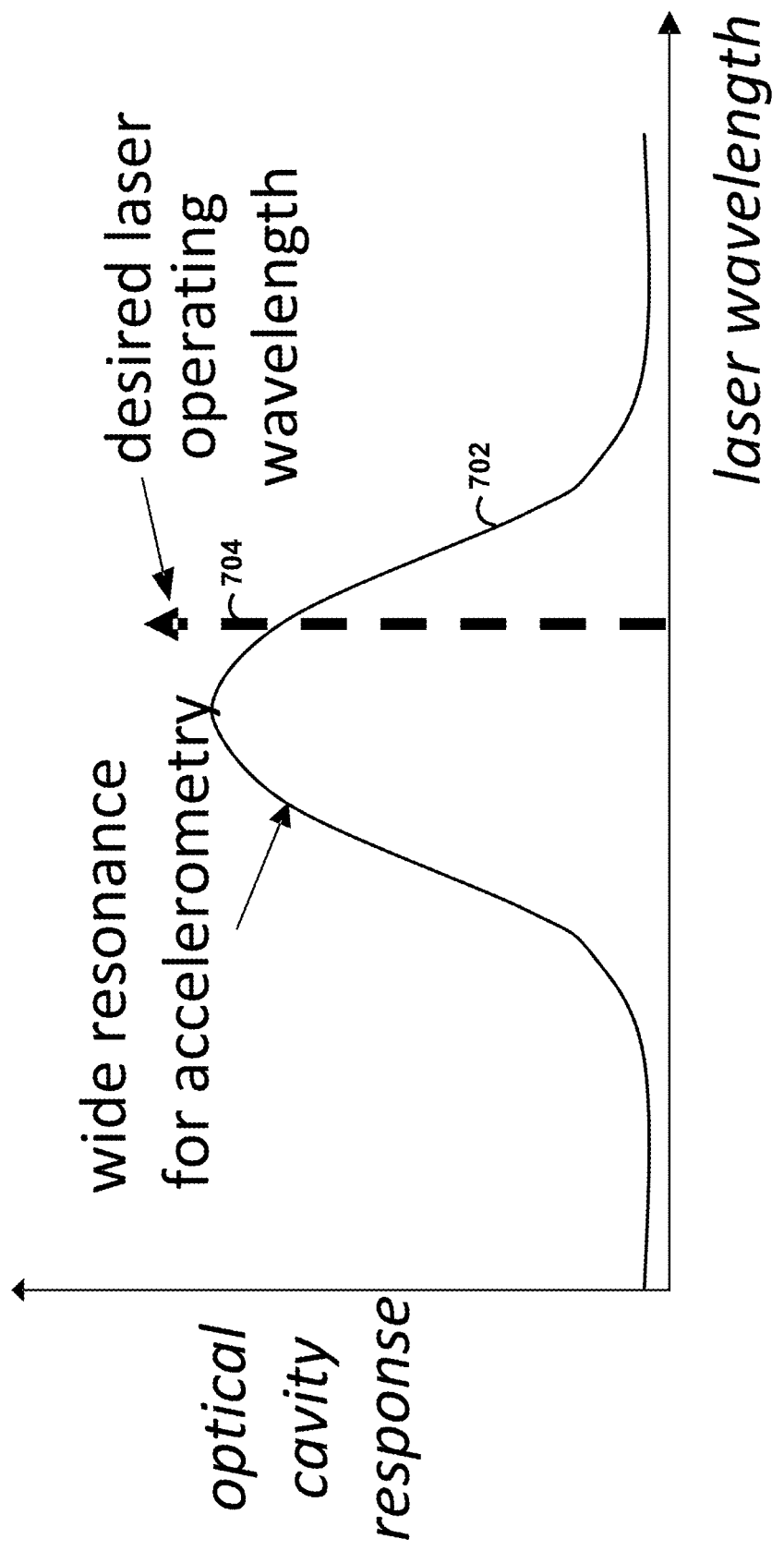
FIG. 7 is a conceptual diagram illustrating an example of a wide optical resonance to drive mechanics of the optomechanical device and an example of a target frequency to lock the laser, in accordance with one or more techniques of this disclosure.

FIG. 7 is a conceptual diagram illustrating an example of wide optical resonance 702 to drive mechanics of the optomechanical device and an example of a target frequency 704 to lock the laser, in accordance with one or more techniques of this disclosure. FIG. 7 is discussed with reference to FIGS. 1-6 for example purposes only. The abscissa axis (e.g., horizontal axis) of FIG. 7 represents laser wavelength and the ordinate axis (e.g., vertical axis) of FIG. 7 represents an optical cavity response of the laser.

Mechanical motion induces spectral shifts in optical resonance that may create a time-varying detuning of the optical drive. For example, wide optical resonance 702 may shift to the left or right along laser wavelength. The mechanical frequency and amplitude response may be sensitive to laser operating point. As such, optical resonance jitter may destabilize mechanical oscillation. Effective deployment of optomechanical behavior in an application such as accelerometry may benefit from the laser driving mechanical motion operating at a very specific position relative to the optical resonance peak. For example, a laser device driving mechanical motion operating at a very specific position relative to the optical resonance peak may result in an accelerometer device having a lower error and/or noise floor compared to an accelerometer device that does not have a laser driving mechanical motion operating at a very specific position relative to the optical resonance peak. The stability of the laser device drive operating point may be complicated by the coupled optical and mechanical response; that is, the mechanical motion may shift the optical resonance of the structure.

Figure 8:
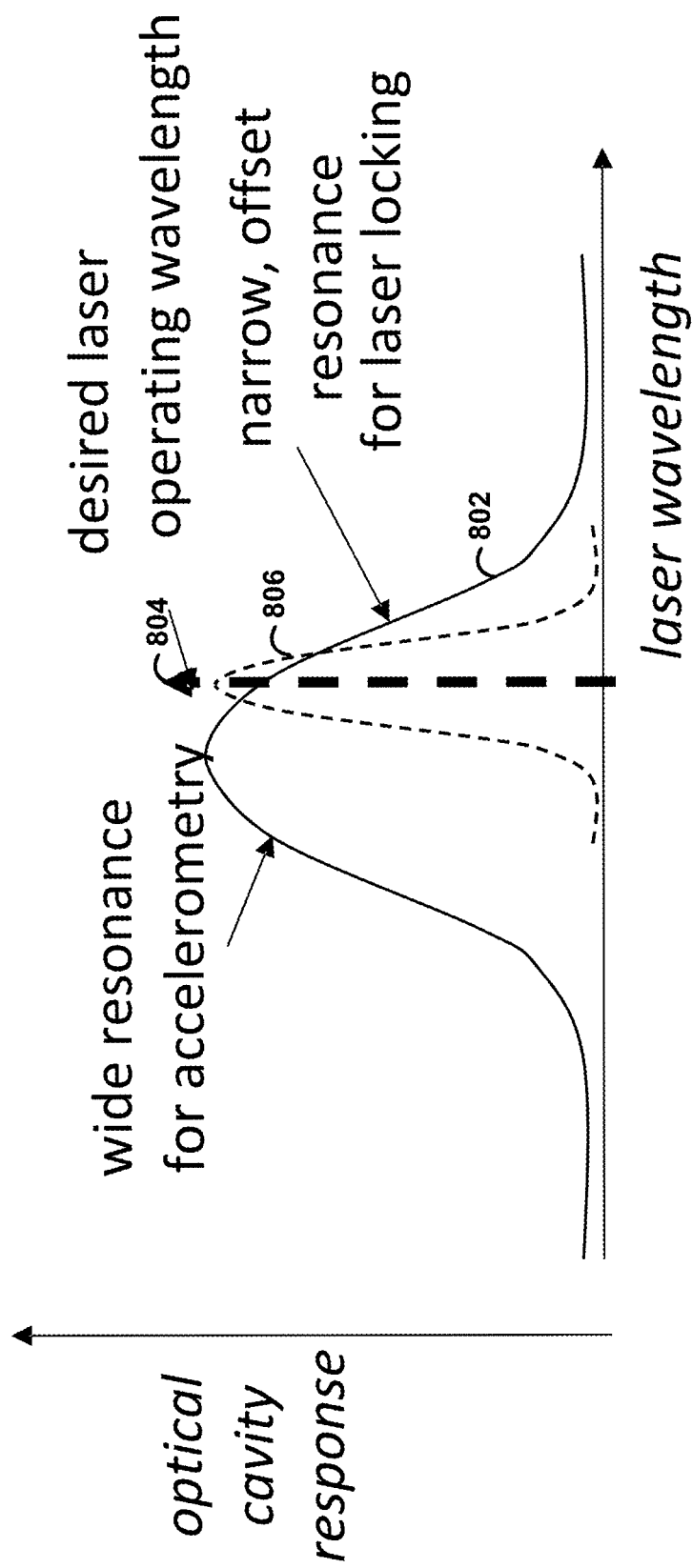
FIG. 8 is a conceptual diagram illustrating an example of wide optical resonance to drive mechanics of the optomechanical device and an example of a narrow resonance to lock the laser to a very precise tuning offset, in accordance with one or more techniques of this disclosure.

FIG. 8 is a conceptual diagram illustrating an example of wide optical resonance 802 to drive mechanics of the optomechanical device and an example of narrow resonance 806 to lock the laser to a very precise tuning offset, in accordance with one or more techniques of this disclosure. FIG. 8 is discussed with reference to FIGS. 1-7 for example purposes only. The abscissa axis (e.g., horizontal axis) of FIG. 8 represents laser wavelength and the ordinate axis (e.g., vertical axis) of FIG. 8 represents an optical cavity response of the laser.

Techniques described herein may be able to lock the operating position of the drive laser at a specific detuning relative to the optical resonance peak. While some systems may rely on locking techniques, such as a Pound-Drever-Hall (PDH) lock, such systems are very difficult to implement due to the broadness of the optical resonance linewidth (e.g., >0.1 nm) and challenges in locking a laser that is not being locked to a "peak." Instead, techniques described herein may include an assembly (e.g., proof mass assembly) configured such that an inner sidewall of the first beam structure has a spatial frequency corresponding to a spatial frequency of an inner sidewall of the second beam structure and such that an outer sidewall of the first beam structure has a spatial frequency corresponding to a spatial frequency of an outer sidewall of the second beam structure. In this way, system 10 may be configured to use the TE polarization, represented by wide optical resonance 802, to drive the mechanical response of the device and the TM polarization, represented by narrow resonance 806, to lock a laser frequency. For example, system 10 may be configured to use a peak of wide optical resonance 802 to drive mechanics of assembly 616 and a peak of narrow optical resonance 806 to determine an optical resonance peak 804 that is detuned from the peak of wide optical resonance 802 by a specified amount (e.g. one-fourth of the linewidth of wide optical resonance 802). Locking the laser wavelength to the TM polarization resonance may allow the detuning relative to the TE polarization resonance to be locked, which may help to mitigate TE polarization resonance shifting induced noise on the mechanical frequency drive and readout.

Figure 9A:
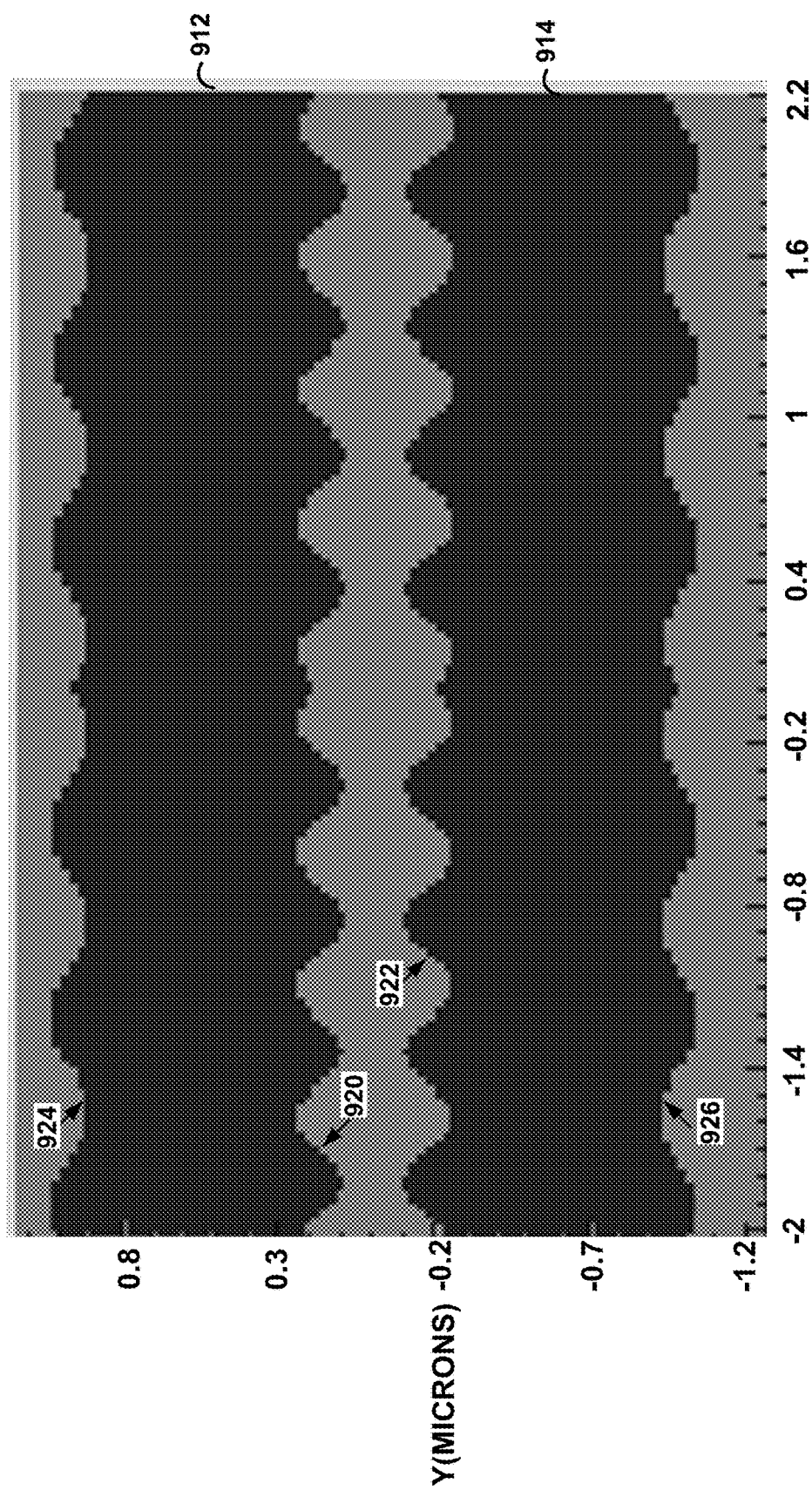
FIG. 9A is a conceptual diagram illustrating a first view of an example assembly configured for a wide optical resonance to drive mechanics of the optomechanical device and for a narrow resonance to lock the laser to a very precise tuning offset, in accordance with one or more techniques of this disclosure.

FIG. 9A is a conceptual diagram illustrating a first view of an example assembly 916 configured for a wide optical resonance to drive mechanics of the optomechanical device and for a narrow resonance to lock the laser to a very precise tuning offset, in accordance with one or more techniques of this disclosure. In some examples, assembly 916 includes a proof mass assembly. The abscissa axis (e.g., horizontal axis) of FIG. 9A represents position of assembly 916 along a horizontal direction in microns and the ordinate axis (e.g., vertical axis) of FIG. 9A represents a position of assembly 916 along a vertical direction in microns.

Figure 9B:
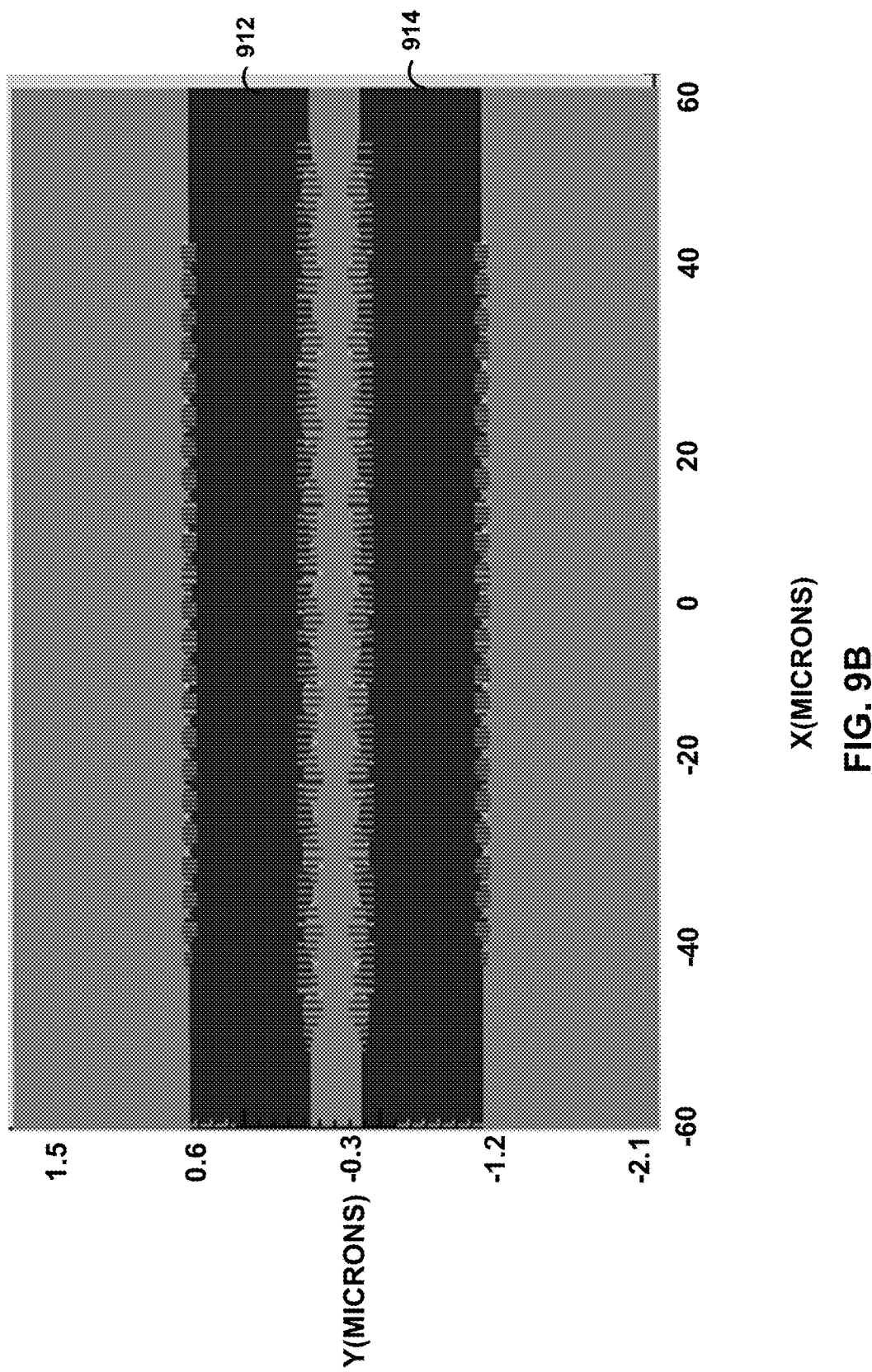
FIG. 9B is a conceptual diagram illustrating a second view of the example assembly of FIG. 9A, in accordance with one or more techniques of this disclosure.

FIG. 9B is a conceptual diagram illustrating a second view of the example assembly 916 of FIG. 9A, in accordance with one or more techniques of this disclosure. The abscissa axis (e.g., horizontal axis) of FIG. 9B represents position of assembly 916 along a horizontal direction in microns and the ordinate axis (e.g., vertical axis) of FIG. 9B represents a position of assembly 916 along a vertical direction in microns. FIGS. 9A, 9B are discussed with reference to FIGS. 1-8 for example purposes only.

Note that two nanobeams (e.g., beam structure 912 and beam structure 914) should not be thought of as separate channels for the TM and TE optical signals. The TM and TE optical signals may co-propagate through assembly 916 and can be expected to be delivered to the nanobeams by, for example, but not limited to, a "y-splitter" architecture. The y-splitter can take the TM and TE-polarized optical signals and inject the TM and TE-polarized optical signals into the dual-nanobeam optical channel with the appropriate spatial optical field distribution such that the dual-nanobeam optical channel can excite the resonances depicted in FIGS. 10 and 11. The process may be reciprocal such the TE and TM optical signals may continue to co-propagate away from the dual-nanobeam structure and out through the y-splitter architecture into the system shown in FIG. 6. Designing first beam structure 912 and second beam structure 914 to simultaneously support orthogonal polarization states may help to minimize cross-talk (e.g. no coherent interaction/interference) and simplify first beam structure 912 and second beam structure 914 separation for signal processing purposes.

In the example of FIGS. 9A, 9B, inner sidewall 920 of beam structure 912 comprises a sine wave having a first inner spatial frequency and inner sidewall 922 of beam structure 914 comprises a sine wave having a second inner spatial frequency. In the example of FIGS. 9A, 9B, the first inner spatial frequency corresponds to (e.g., equals, matches, etc.) the second inner spatial frequency. Similarly, outer sidewall 924 of beam structure 912 comprises a sine wave having a first outer spatial frequency and outer sidewall 926 of beam structure 914 comprises a sine wave having a second outer spatial frequency. In the example of FIGS. 9A, 9B, the first outer spatial frequency corresponds to (e.g., equals, matches, etc.) the second outer spatial frequency. In the example of FIGS. 9A, 9B, the first inner spatial frequency and the first outer spatial frequency are not equal. In some examples, however, the first inner spatial frequency may correspond to (e.g., equals, matches, etc.) the first outer spatial frequency.

In the example of FIGS. 9A, 9B, inner sidewall 920 of beam structure 912 comprises a continuous sine wave, however, in other examples, an inner sidewall may be discrete periodic. In the example of FIGS. 9A, 9B, inner sidewall 920 of beam structure 912 comprises spatial features (e.g., a sine wave) that include periodic change in height, however, in other examples, an inner sidewall may include spatial features that include periodic change in only width or both width and height. In some examples, an outer sidewall may include spatial features that include periodic change in only height, only width, or both width and height.

In some examples, inner sidewall 920 of beam structure 912 may comprise a first plurality of inner spatial frequencies corresponding to a second plurality of inner spatial frequencies of inner sidewall 922 of beam structure 914. That is, the first plurality of inner spatial frequencies of inner sidewall 920 of beam structure 912 may represent a combination or superposition of two or more frequencies. For example, inner sidewall 920 may include one or more of a set (e.g., 1, 2, 3, etc.) of sine waves, a square wave, a triangle wave, a sawtooth wave, or another plurality of inner spatial frequencies. Similarly, in some examples, outer sidewall 924 of beam structure 912 may have a first plurality of outer spatial frequencies corresponding to a second plurality of outer spatial frequencies of outer sidewall 926 of beam structure 914.

The first plurality of inner spatial frequencies included in inner sidewall 920 may have at least one spatial frequency that is not included in the first plurality of outer spatial frequencies included in outer sidewall 924. For example, inner sidewall 920 and inner sidewall 922 may each include a particular inner spatial frequency that is not included in outer sidewall 924 and outer sidewall 926. Similarly, in some examples, outer sidewall 924 and outer sidewall 926 may each include a particular inner spatial frequency that is not included in inner sidewall 920 and inner sidewall 922.

The first plurality of inner spatial frequencies included in inner sidewall 920 may have at least one spatial frequency that corresponds to a spatial frequency included in the first plurality of outer spatial frequencies included in outer sidewall 924. For example, inner sidewall 920 and inner sidewall 922 may each include a particular inner spatial frequency that corresponds to (e.g., equals, matches, etc.) a spatial frequency included in outer sidewall 924 and outer sidewall 926. Similarly, in some examples, outer sidewall 924 and outer sidewall 926 may each include a particular inner spatial frequency that corresponds to (e.g., equals, matches, etc.) a spatial frequency included in inner sidewall 920 and inner sidewall 922.

Figure 10:
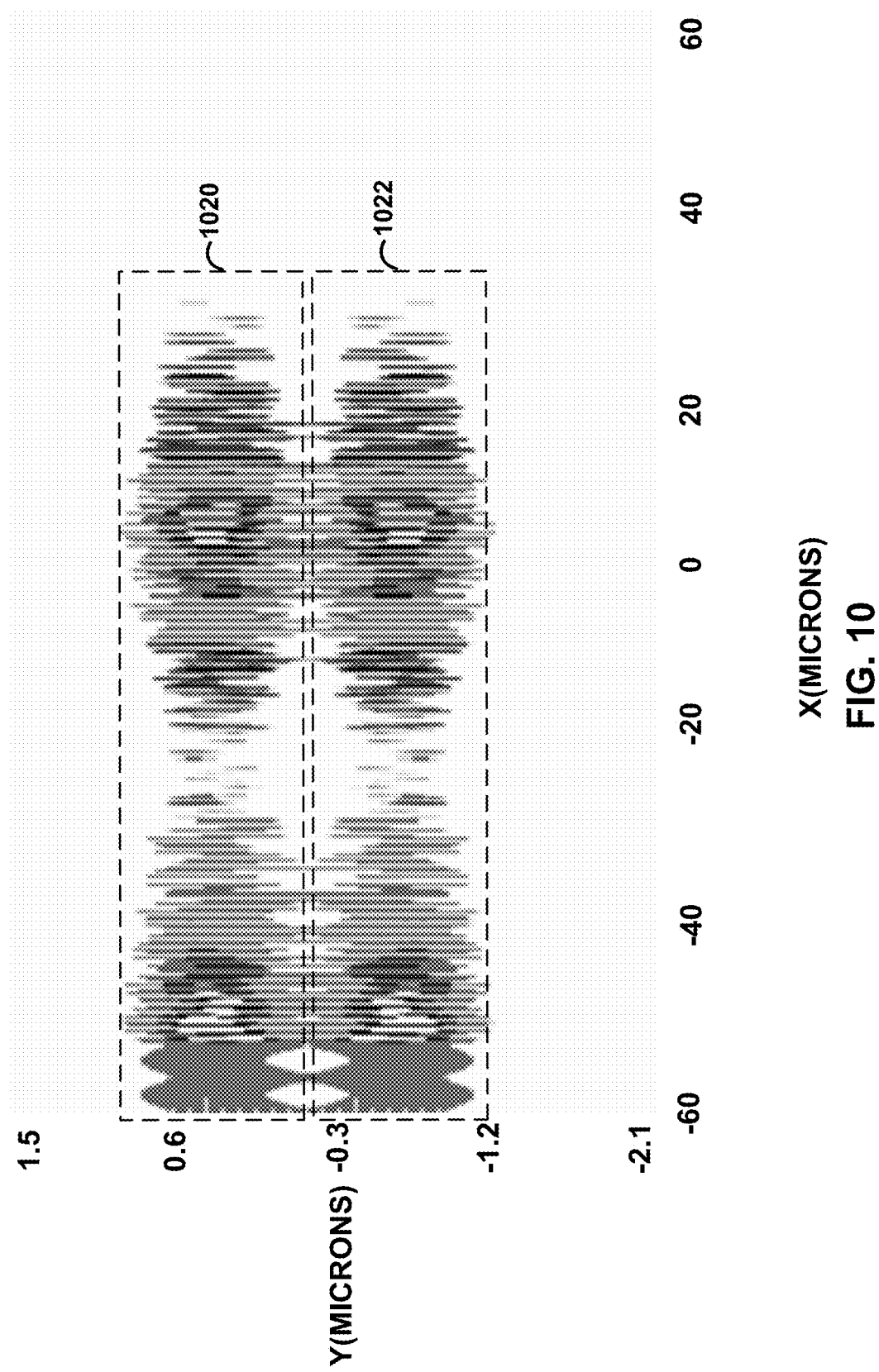
FIG. 10 is a conceptual diagram illustrating an example top-view, optical intensity distribution of a Transverse Magnetic (TM) polarization resonance for a narrow resonance to lock the laser to a very precise tuning offset, in accordance with one or more techniques of this disclosure.

FIG. 10 is a conceptual diagram illustrating an example top-view, optical intensity distribution of a TM polarization resonance for a narrow resonance to lock the laser to a very precise tuning offset, in accordance with one or more techniques of this disclosure. FIG. 10 is discussed with reference to FIGS. 1-8, 9A, 9B for example purposes only. The abscissa axis (e.g., horizontal axis) of FIG. 10 represents position of an assembly (e.g., proof mass assembly) along a horizontal direction in microns and the ordinate axis (e.g., vertical axis) of FIG. 10 represents a position of the assembly along a vertical direction in microns. As shown, a portion 1020 of the TM polarization resonance is spatially distributed within a first beam structure of the assembly (e.g., first beam structure 912 of FIG. 9) and a portion 1022 of the TM polarization resonance is spatially distributed within a second beam structure of the assembly (e.g., second beam structure 914 of FIG. 9).

Figure 11:
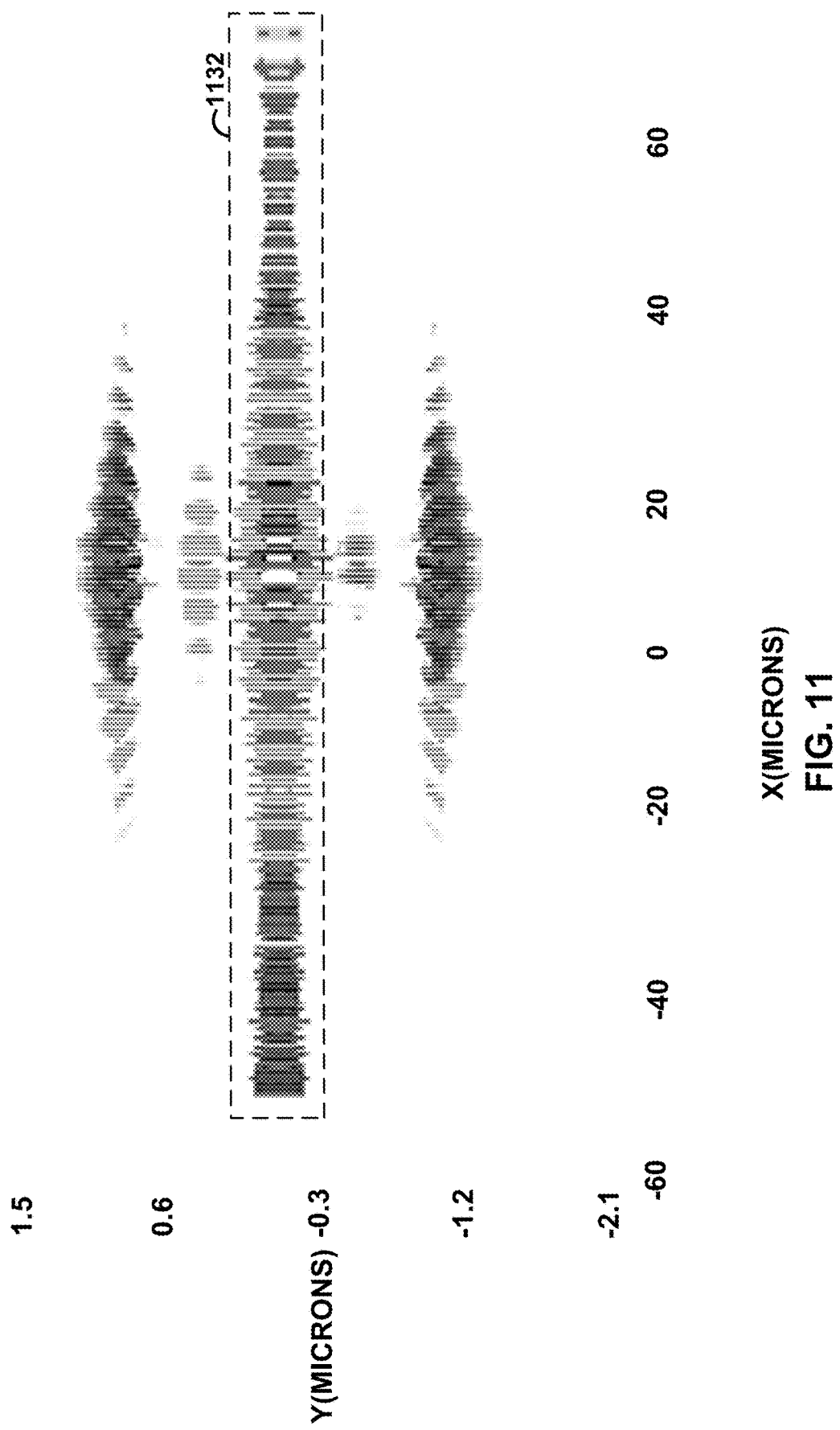
FIG. 11 is a conceptual diagram illustrating an example top-view, optical intensity distribution of a Transverse Electric (TE) polarization resonance for an assembly configured for a wide optical resonance to drive mechanics of the optomechanical device, in accordance with one or more techniques of this disclosure.

FIG. 11 is a conceptual diagram illustrating an example top-view, optical intensity distribution of a TE polarization resonance for a wide optical resonance to drive mechanics of the optomechanical device, in accordance with one or more techniques of this disclosure. The abscissa axis (e.g., horizontal axis) of FIG. 11 represents position of an assembly (e.g., proof mass assembly) along a horizontal direction in microns and the ordinate axis (e.g., vertical axis) of FIG. 11 represents a position of the assembly along a vertical direction in microns. FIG. 11 is discussed with reference to FIGS. 1-8, 9A, 9B, 10 for example purposes only. As shown, TE polarization resonance 1132 is focused between a first beam structure of the assembly (e.g., first beam structure 912 of FIG. 9) and a second beam structure of the assembly (e.g., first beam structure 914 of FIG. 9). While FIG. 11 is discussed separately from FIG. 10, it should be understood that the TM polarization resonance illustrated in FIG. 10 may co-propagate with the TE polarization resonance illustrated in FIG. 11 within a single assembly (e.g., assembly 916 of FIG. 9).

Figure 12:
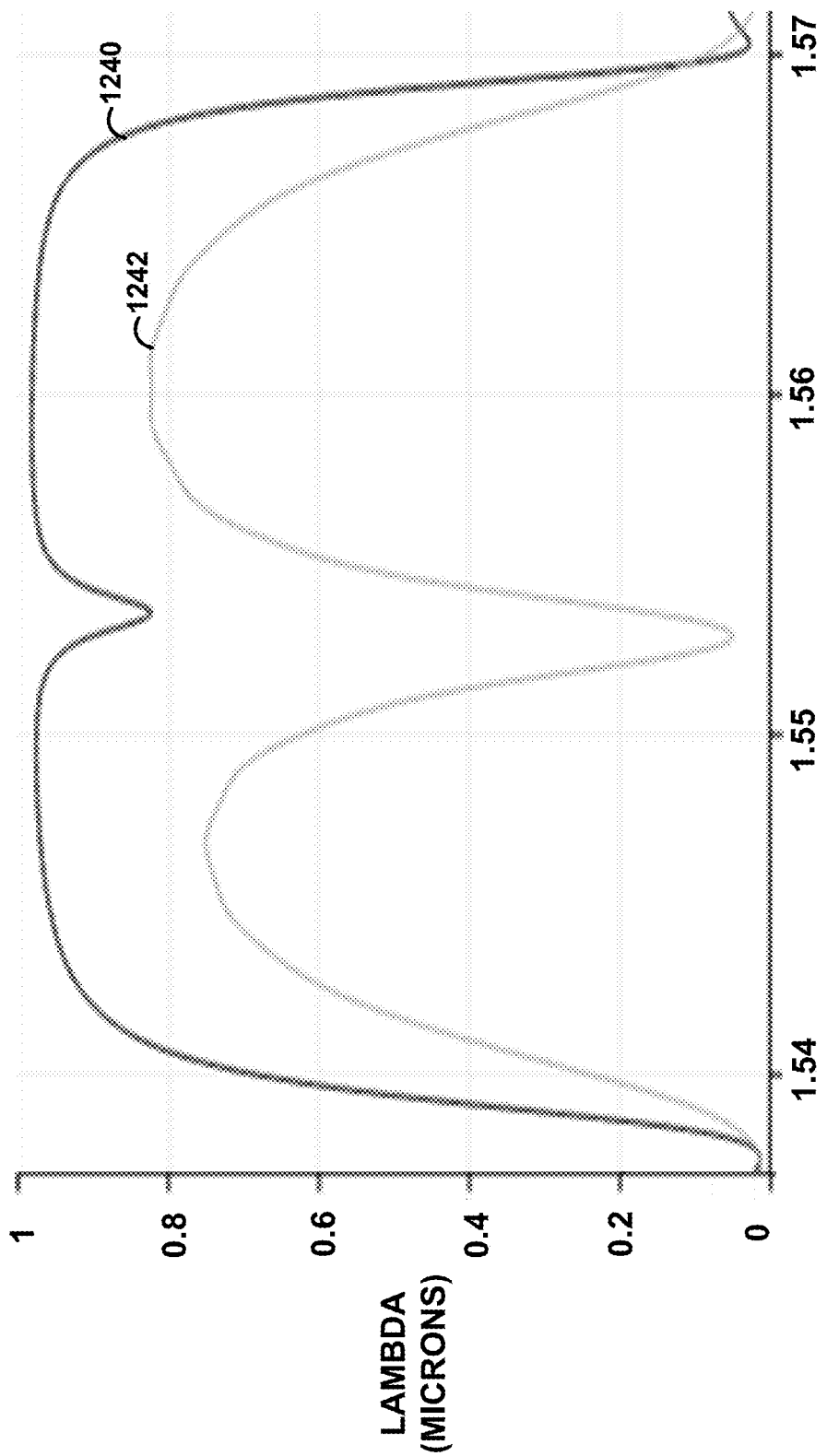
FIG. 12 is a conceptual diagram illustrating an example TE polarization resonance and TM polarization resonance for an assembly, in accordance with one or more techniques of this disclosure.

FIG. 12 is a conceptual diagram illustrating an example TE polarization resonance 1242 and TM polarization resonance 1240 for an assembly (e.g., proof mass assembly), in accordance with one or more techniques of this disclosure. FIG. 12 is discussed with reference to FIGS. 1-8, 9A, 9B, 10, 11 for example purposes only. The abscissa axis (e.g., horizontal axis) of FIG. 11 represents lambda (e.g., optical wavelength/laser wavelength) along a horizontal direction in microns and the ordinate axis (e.g., vertical axis) of FIG. 12 represents normalized reflectance (e.g., reflected power from cavity).

TE polarization resonance 1242 and TM polarization resonance 1240 may represent an example response from assembly 916 of FIG. 9. As shown in the example of FIG. 12, TM polarization resonance 1240 is narrower than TE polarization resonance 1242 and TM polarization resonance 1240 has a peak that is offset from a peak of TE polarization resonance 1242. In this way, system 10 may be configured to lock a laser wavelength of light-emitting module 12A, 12B to TM polarization resonance 1240 to allow the detuning relative to TE polarization resonance 1242, which may help to mitigate TE polarization resonance 1242 shifting induced noise on the mechanical frequency drive and readout.

Figure 13A:
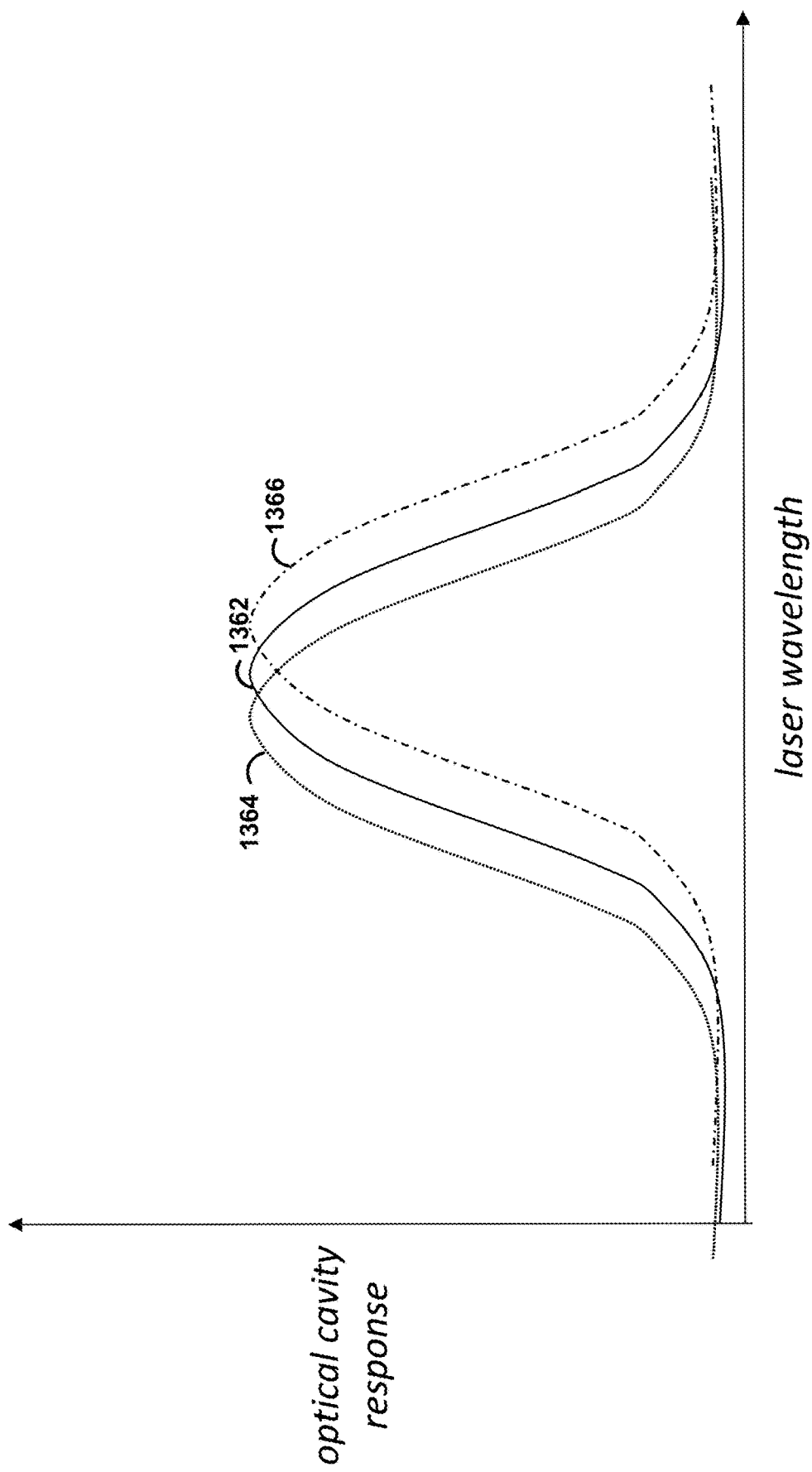
FIG. 13A is a conceptual diagram illustrating example optical cavity responses to mechanical motion, in accordance with one or more techniques of this disclosure.

FIG. 13A is a conceptual diagram illustrating example optical cavity responses to mechanical motion, in accordance with one or more techniques of this disclosure. FIG. 13A is discussed with reference to FIGS. 1-8, 9A, 9B, 10, 11, and 12 for example purposes only. The abscissa axis (e.g., horizontal axis) of FIG. 13A represents laser wavelength and the ordinate axis (e.g., vertical axis) of FIG. 13A represents a first optical response 1362 during a first external perturbation of an assembly (e.g., proof mass assembly), a second optical response 1364 during a second external perturbation of the assembly, and a third optical response 1366 during a third external perturbation of the assembly, in accordance with one or more techniques of this disclosure.

Figure 13B:
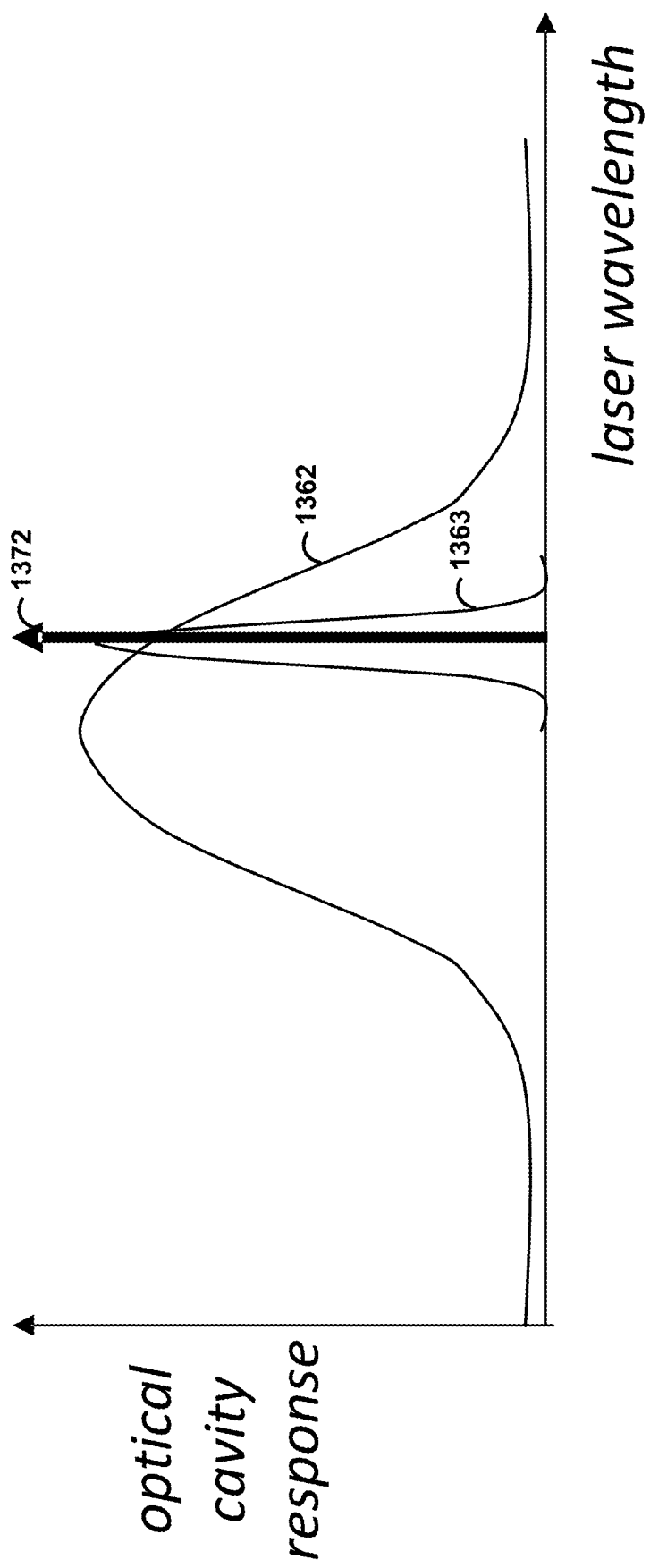
FIG. 13B is a conceptual diagram illustrating an example narrow offset optical resonance to lock the laser to a very precise tuning offset for a first optical response of FIG. 13A, in accordance with one or more techniques of this disclosure.

FIG. 13B is a conceptual diagram illustrating an example narrow offset optical resonance 1363 to lock the laser to a very precise tuning offset for the first optical response 1362 of FIG. 13A, in accordance with one or more techniques of this disclosure. The abscissa axis (e.g., horizontal axis) of FIG. 13B represents laser wavelength and the ordinate axis (e.g., vertical axis) of FIG. 13B represents an optical cavity response of the laser. FIG. 13B is discussed with reference to FIGS. 1-8, 9A, 9B, 10, 11, and 12 for example purposes only.

Techniques described herein may help to allow a secondary narrow offset optical resonance for locking an optical signal output by laser device 612. Narrow offset optical resonance 1363 may be coupled to the mechanical motion of the optomechanical structure, such that the narrow offset optical resonance 1363 will similarly move around with first optical response 1362. Moreover, narrow offset optical resonance 1363 may "drag" laser device 612 as the narrow, offset optical resonance 1363 moves in response to mechanical motion, effectively stabilizing the mechanical oscillations because laser device 612 detuning point may be fixed in time.

For example, assembly 616 may include differing inner sidewall and outer sidewall corrugation periods. As such, wavelength servo 645 may be configured to drive laser device 612 to use narrow offset optical resonance 1363 resulting from assembly 616 to lock a frequency 1372 of an optical signal output by laser device 612. In this example, mechanical drive servo 646 may be configured to use first optical response 1362 resulting from assembly 616 to drive the mechanical response of assembly 616. In this way, feedback unit 626 may help to drive laser device 612 to lock the wavelength of an optical signal to a very precise detuning offset, which may help to mitigate TE polarization resonance shifting induced noise on the mechanical frequency drive and readout.

Figure 13C:
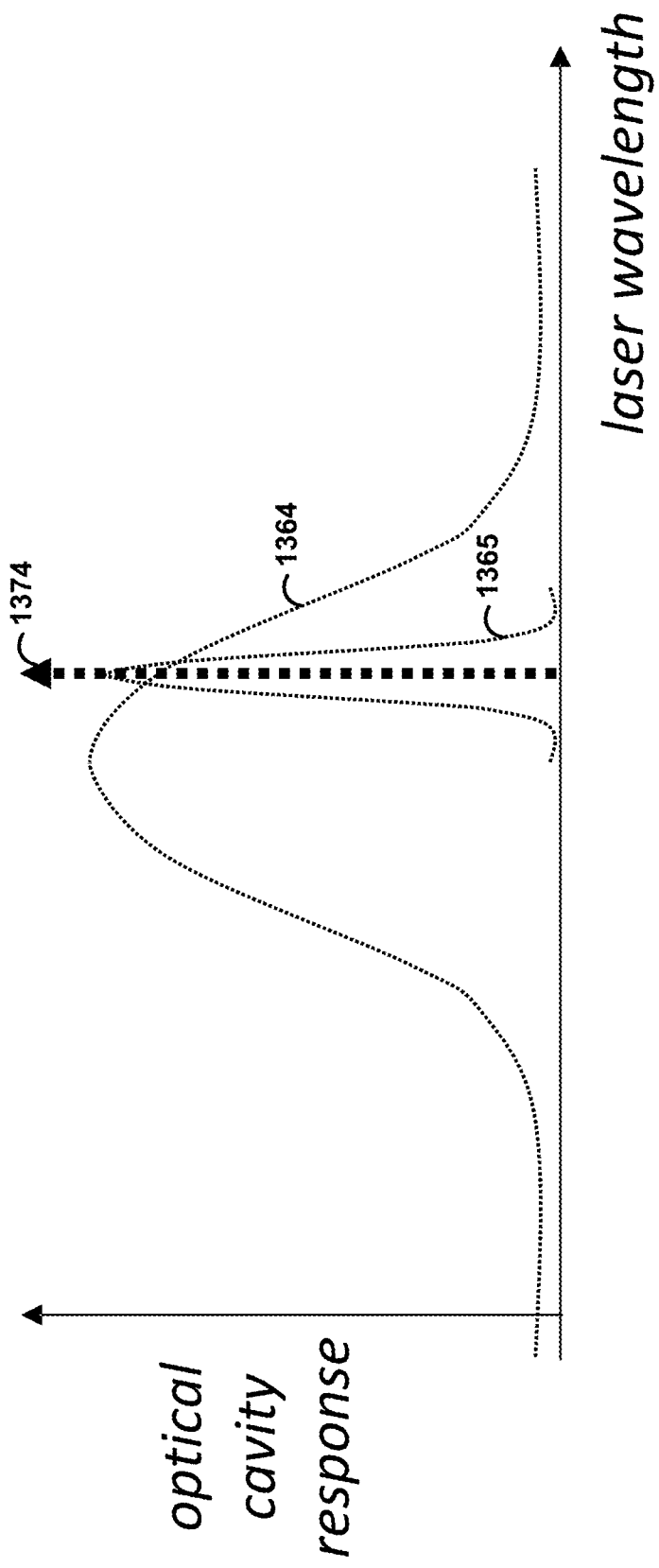
FIG. 13C is a conceptual diagram illustrating an example narrow offset optical resonance to lock the laser to a very precise tuning offset for a second optical response of FIG. 13A, in accordance with one or more techniques of this disclosure.

FIG. 13C is a conceptual diagram illustrating an example narrow offset optical resonance 1365 to lock the laser to a very precise tuning offset for the second optical response 1364 of FIG. 13A, in accordance with one or more techniques of this disclosure. FIG. 13C is discussed with reference to FIGS. 1-8, 9A, 9B, 10, 11, and 12 for example purposes only. The abscissa axis (e.g., horizontal axis) of FIG. 13C represents laser wavelength and the ordinate axis (e.g., vertical axis) of FIG. 13C represents an optical cavity response of the laser.

Techniques described herein may help to allow a secondary narrow offset optical resonance 1365 for locking an optical signal output by laser device 612. Narrow offset optical resonance 1365 may be coupled to the mechanical motion of the optomechanical structure, such that the narrow offset optical resonance 1365 will similarly move around with second optical response 1364. Moreover, narrow offset optical resonance 1365 may "drag" laser device 612 as the narrow, offset optical resonance 1365 moves in response to mechanical motion, effectively stabilizing the mechanical oscillations because laser device 612 detuning point may be fixed in time.

For example, assembly 616 may include differing inner sidewall and outer sidewall corrugation periods. As such, wavelength servo 645 may be configured to drive laser device 612 to use narrow offset optical resonance 1365 resulting from assembly 616 to lock a frequency 1374 of an optical signal output by laser device 612. In this example, mechanical drive servo 646 may be configured to use second optical response 1364 resulting from assembly 616 to drive the mechanical response of assembly 616. In this way, feedback unit 626 may help to drive laser device 612 to lock the wavelength of an optical signal to a very precise detuning offset, which may help to mitigate TE polarization resonance shifting induced noise on the mechanical frequency drive and readout.

Figure 13D:
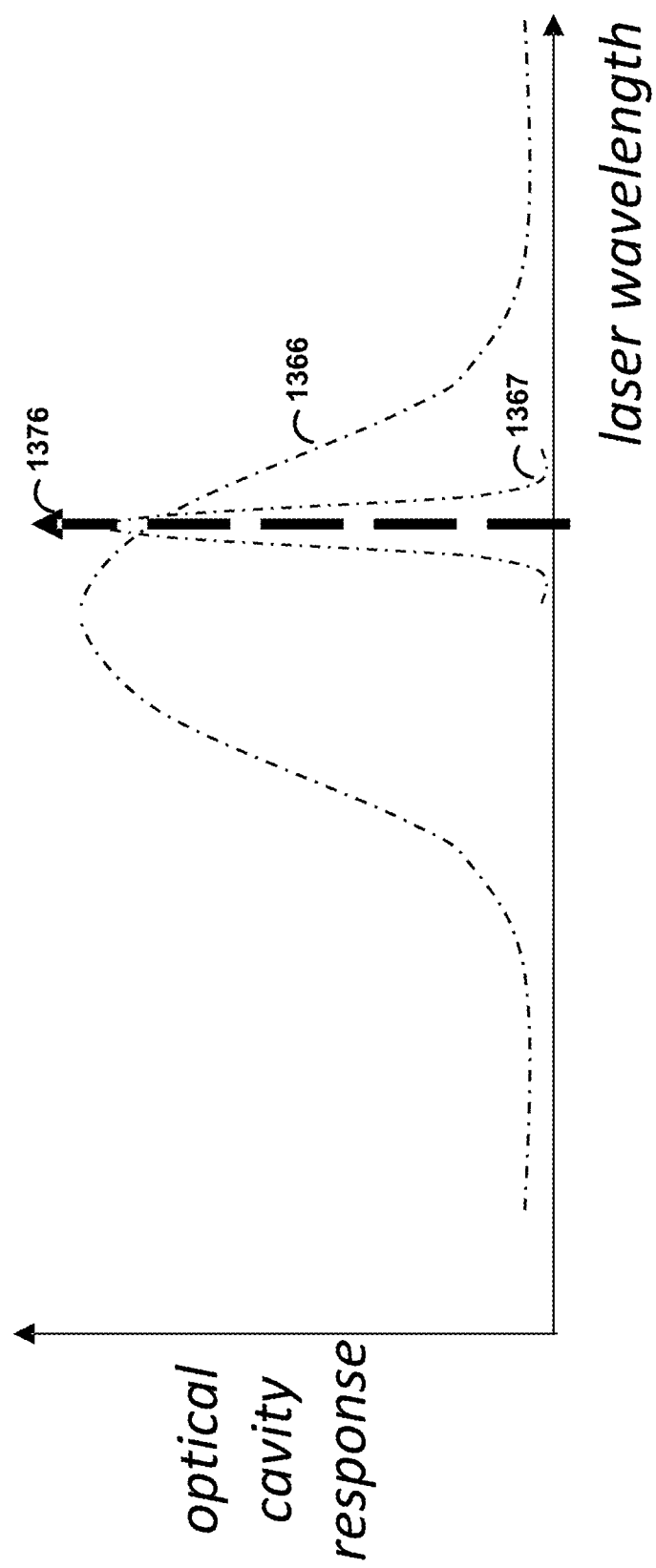
FIG. 13D is a conceptual diagram illustrating an example narrow offset optical resonance to lock the laser to a very precise tuning offset for a third optical response of FIG. 13A, in accordance with one or more techniques of this disclosure.

FIG. 13D is a conceptual diagram illustrating an example narrow resonance to lock the laser to a very precise tuning offset for the third optical response 1366 of FIG. 13A, in accordance with one or more techniques of this disclosure. FIG. 13D is discussed with reference to FIGS. 1-8, 9A, 9B, 10, 11, 12, 13A, 13B, 13C, 13A, 13B, 13C for example purposes only. The abscissa axis (e.g., horizontal axis) of FIG. 13D represents laser wavelength and the ordinate axis (e.g., vertical axis) of FIG. 13D represents an optical cavity response of the laser.

Techniques described herein may help to allow a secondary narrow offset optical resonance 1367 for locking an optical signal output by laser device 612. Narrow offset optical resonance 1367 may be coupled to the mechanical motion of the optomechanical structure, such that the narrow offset optical resonance 1367 will similarly move around with third optical response 1366. Moreover, narrow offset optical resonance 1367 may "drag" laser device 612 as the narrow offset optical resonance 1367 moves in response to mechanical motion, effectively stabilizing the mechanical oscillations because laser device 612 detuning point may be fixed in time.

For example, assembly 616 may include differing inner sidewall and outer sidewall corrugation periods. As such, wavelength servo 645 may be configured to drive laser device 612 to use narrow offset optical resonance 1367 resulting from assembly 616 to lock a frequency 1376 of an optical signal output by laser device 612. In this example, mechanical drive servo 646 may be configured to use third optical response 1366 resulting from assembly 616 to drive the mechanical response of assembly 616. In this way, feedback unit 626 may help to drive laser device 612 to lock the wavelength of an optical signal to a very precise detuning offset, which may help to mitigate TE polarization resonance shifting induced noise on the mechanical frequency drive and readout.

Figure 14:
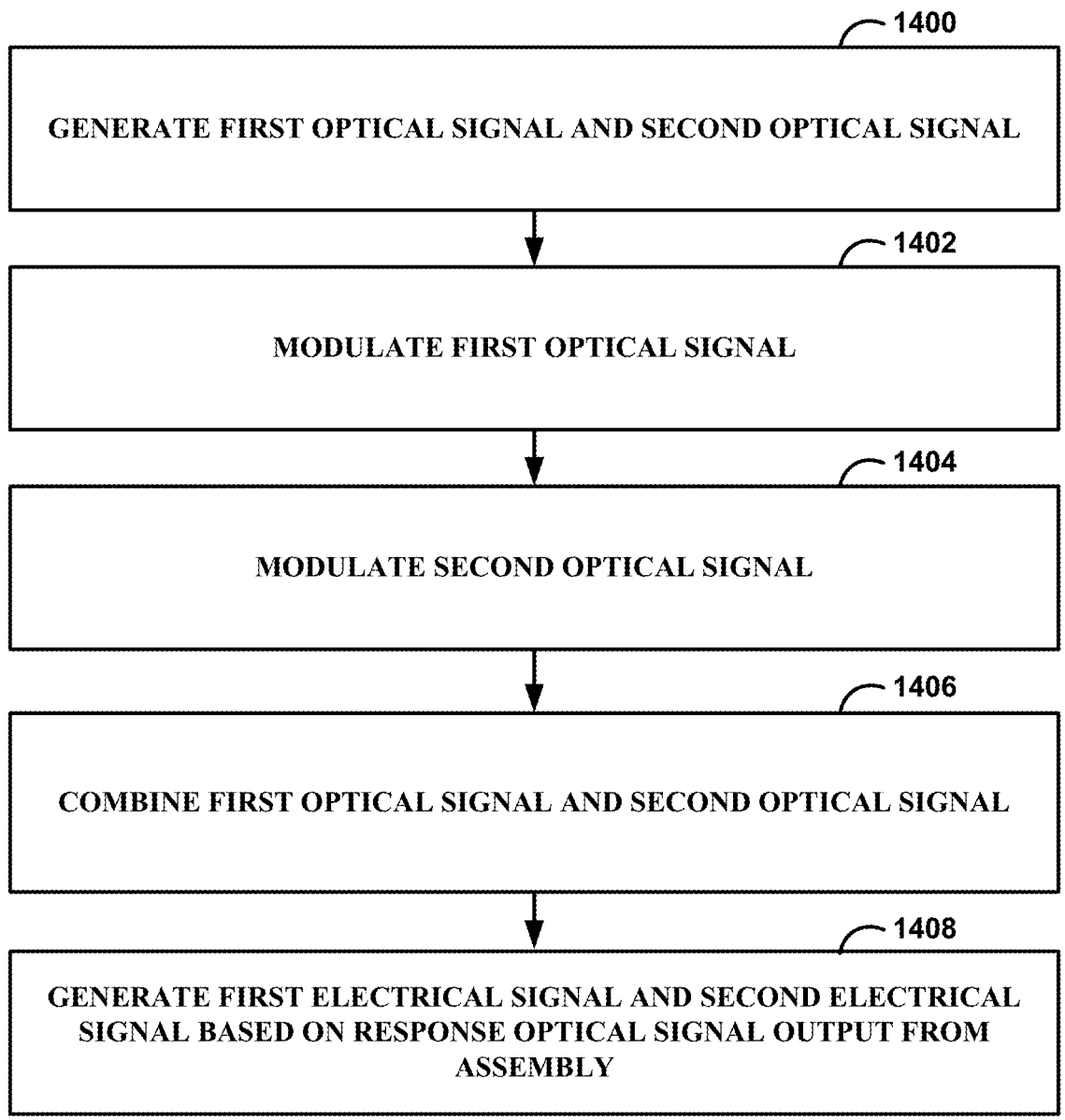
FIG. 14 is a flow diagram illustrating an example process for resonator stabilization in optomechanical devices, in accordance with one or more techniques of this disclosure.

FIG. 14 is a flow diagram illustrating an example process for tracking a mechanical resonance of an assembly (e.g., proof mass assembly), in accordance with one or more techniques of this disclosure. FIG. 14 is discussed with reference to FIGS. 1-8, 9A, 9B, 10, 11, 12, and 13A-13D for example purposes only.

Laser device 612 generates a first optical signal and a second optical signal (1400). EOM 615 modulates the second optical signal (1402). For example, EOM 615 modulates the optical signal output by tap 613 about a peak of the TM polarization resonance of assembly 616. EOM 622 modulates the second optical signal (1404). For example, EOM 622 modulates the optical signal output by tap 613 about a peak of the TE polarization resonance of assembly 616 or detuned from the peak of the TE polarization resonance of assembly 616.

Combiner 619 combines the first optical signal and the second optical signal (1406). In some examples, combining the first optical signal and the second optical signals comprises directing the first optical signal and the second optical signal into assembly 616, where an inner sidewall of a first beam structure of assembly 616 has a spatial frequency corresponding to a spatial frequency of an inner sidewall of a second beam structure of assembly 616 and wherein an outer sidewall of the first beam structure has a spatial frequency corresponding to a spatial frequency of an outer sidewall of the second beam structure. For example, circulator 672 outputs a combined optical signal to assembly 616. For instance, optical circulator 672 outputs an optical signal output by combiner 619 to assembly 616 and receives an optical signal reflected from assembly 616.

PBS 684 and photodetectors 624A, 624B generate a first electrical signal and a second electrical signal based on a response optical signal output from the assembly (1408). In some examples, the response optical signal is generated in response to the combined optical signal. For example, the response optical signal is generated, by circulator 672, as a reflection of the combined optical signal from assembly 616.

In some examples, EOM 622 modulates the second optical signal based on the second electrical signal. For example, mechanical drive servo 646 may be configured to identify and generate a feedback signal based on mechanically-induced modulation of the TE-polarized optical signal interacting with assembly 616. In some examples, laser device 612 may be configured to generate the first optical signal and the second optical signal to be laser locked to a frequency that is based on the first electrical signal. For example, wavelength servo 645 may be configured to determine, using the first electrical signal, a peak of a TM polarization resonance of assembly 616. In this example, wavelength servo 645 may be configured to drive laser device 612 to a frequency corresponding (e.g., equal to, matching, etc.) to the peak of the TM polarization resonance of assembly 616. In this example, tap 613 may be configured to generate the first optical signal using a portion of a single optical signal output by laser device 612 and to generate the second optical signal using a portion of the single optical signal.

The optomechanical device described herein may include only analog circuitry, only digital circuitry, or a combination of analog circuitry and digital circuitry. Digital circuitry may include, for example, a microcontroller on a single integrated circuit containing a processor core, memory, inputs, and outputs. For example, digital circuitry of the optomechanical device described herein may include one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing analog circuitry and/or digital circuitry, alone or in combination with other logic circuitry, or any other equivalent circuitry. Digital circuitry may utilize hardware, software, firmware, or any combination thereof for achieving the functions described.

What is claimed is:

1. An optomechanical device for stabilizing an optomechanical resonator, the optomechanical device comprising:
an assembly comprising a first beam structure and a second beam structure, wherein an inner sidewall of the first beam structure has a first inner spatial frequency corresponding to a second inner spatial frequency of an inner sidewall of the second beam structure and wherein an outer sidewall of the first beam structure has a first outer spatial frequency corresponding to a second outer spatial frequency of an outer sidewall of the second beam structure; and
a circuit configured to:
generate a first optical signal and a second optical signal;
modulate the first optical signal;
modulate the second optical signal;
combine the first optical signal and the second optical signal into a combined optical signal after modulating the first optical signal and the second optical signal, wherein combining the first optical signal and the second optical signals comprises directing the combined optical signal into the assembly;
generate a first electrical signal and a second electrical signal based on a response optical signal output from the assembly, wherein the response optical signal is generated in response to the combined optical signal;
wherein, to modulate the second optical signal, the circuit is configured to modulate the second optical signal based on the second electrical signal; and
wherein, to generate the first optical signal and the second optical signal, the circuit is configured to generate the first optical signal and the second optical signal to be laser locked to a frequency that is based on the first electrical signal.

2. The optomechanical device of claim 1, wherein the circuit comprises a laser device and tap and wherein to generate the first optical signal and the second optical signal:
the laser device is configured to generate a single optical signal; and
the tap is configured to generate the first optical signal using a portion of the single optical signal and to generate the second optical signal using a portion of the single optical signal.

3. The optomechanical device of claim 2, wherein, to generate the first optical signal and the second optical signal, the circuit is configured to:
lock the laser device to a frequency corresponding to a peak of the transverse magnetic (TM) polarization resonance of the assembly.

4. The optomechanical device of claim 1, wherein the circuit comprises an Electro-Optic Modulator (EOM) and wherein to modulate the second optical signal, the circuit is configured to:
modulate the second optical signal to interact with a transverse electric (TE) polarization resonance of the assembly.

5. The optomechanical device of claim 1, wherein the inner sidewall of the first beam structure has a first plurality of inner spatial frequencies corresponding to a second plurality of inner spatial frequencies of the inner sidewall of the second beam structure and wherein the outer sidewall of the first beam structure has a first plurality of outer spatial frequencies corresponding to a second plurality of outer spatial frequencies of the outer sidewall of the second beam structure.

6. The optomechanical device of claim 5, wherein the first plurality of inner spatial frequencies has at least one spatial frequency that is not included in the first plurality of outer spatial frequencies.

7. The optomechanical device of claim 5, wherein the first plurality of inner spatial frequencies has at least one spatial frequency that corresponds to a spatial frequency included in the first plurality of outer spatial frequencies of the outer sidewall of the first beam structure.

8. The optomechanical device of claim 1,
wherein the inner sidewall of the first beam structure comprises a sine wave having the first inner spatial frequency and wherein the inner sidewall of the second beam structure comprises a sine wave having the second inner spatial frequency; and
wherein the outer sidewall of the first beam structure comprises a sine wave having the first outer spatial frequency and wherein the outer sidewall of the second beam structure comprises a sine wave having the second outer spatial frequency.

9. The optomechanical device of claim 1,
wherein the first inner spatial frequency and the first outer spatial frequency are not equal.

10. The optomechanical device of claim 1,
wherein the inner sidewall of the first beam structure comprises a first spatial feature having the first inner spatial frequency, wherein the first spatial feature is continuous or discrete periodic and wherein the first spatial feature comprises a periodic change in width, height, or width and height; and
wherein the inner sidewall of the second beam structure comprises a second spatial feature having the second inner spatial frequency, wherein the second spatial feature is continuous or discrete periodic and wherein the second spatial feature comprises a periodic change in width, height, or width and height.

11. The optomechanical device of claim 1,
wherein, to modulate the second optical signal, the circuit is configured to modulate the second optical signal at a frequency corresponding to a mechanical resonance of the assembly; and
wherein to generate the first optical signal and the second optical signal to be laser locked to the frequency, the circuit is configured to generate the first optical signal and the second optical signal to be laser locked to an optical frequency offset from an optical resonance of the Transverse Electric (TE) polarization resonance of the assembly.

12. The optomechanical device of claim 11, wherein to generate the first optical signal and the second optical signal to be laser locked to the frequency offset from the optical resonance of the TE polarization resonance of the assembly, the circuit is configured to generate the first optical signal and the second optical signal to be laser locked to a frequency that corresponds to a frequency offset from the optical resonance by one-quarter of an optical linewidth.

13. The optomechanical device of claim 1, wherein the circuit is configured to:
regulate an intensity of the first optical signal to a first predetermined light intensity value before combining the first optical signal and the second optical signal; and regulate an intensity of the second optical signal to a second predetermined light intensity value before combining the first optical signal and the second optical signal.

14. The optomechanical device of claim 1, wherein the circuit is configured to:
rotate a polarization of the first optical signal output by 90 degrees; or
rotate a polarization of the second optical signal output by 90 degrees.

15. The optomechanical device of claim 1, wherein the circuit is configured to:
receive the response optical signal output from the assembly;
split the response optical signal into a first portion of the response optical signal and a second portion of the response optical signal; and
wherein, to generate the first electrical signal and the second electrical signal, the circuit is configured to generate the first electrical signal based on the first portion of the response optical signal and generate the second electrical signal based on the second portion of the response optical signal.

16. The optomechanical device of claim 15,
wherein first portion of the response optical signal is polarized for a transverse magnetic (TM) polarization resonance of the assembly; and
wherein second portion of the response optical signal is polarized for a transverse electric (TE) polarization resonance of the assembly.

17. The optomechanical device of claim 1, wherein the circuit is configured to:
measure, using the second electrical signal, an acceleration of the assembly.

18. The optomechanical device of claim 1, wherein the assembly comprises a set of double-ended tuning fork (DETF) structures.

19. A method for modulating light for stabilizing an optomechanical resonator, the method comprising:
generating, by a light-emitting module, a first optical signal and a second optical signal;
modulating, by a first electro-optic modulator (EOM), the first optical signal;
modulating, by a second EOM, the second optical signal;
combining the first optical signal and the second optical signal into a combined optical signal after modulating the first optical signal and the second optical signal, wherein combining the first optical signal and the second optical signals comprises directing the combined optical signal into an assembly, wherein an inner sidewall of a first beam structure of the assembly has a first inner spatial frequency corresponding to a second inner spatial frequency of an inner sidewall of a second beam structure of the assembly and wherein an outer sidewall of the first beam structure has a first outer spatial frequency corresponding to a second outer spatial frequency of an outer sidewall of the second beam structure;
generating, by a polarizing beam splitter and one or more photodetectors, a first electrical signal and a second electrical signal based on a response optical signal output from the assembly, wherein the response optical signal is generated in response to the combined optical signal;
wherein modulating the second optical signal is based on the second electrical signal; and
wherein generating the first optical signal and the second optical signal comprises generating the first optical signal and the second optical signal to be laser locked to a frequency that is based on the first electrical signal.

20. An optomechanical device for stabilizing an optomechanical resonator, the optomechanical device comprising a circuit configured to:
generate a first optical signal and a second optical signal;
modulate the first optical signal;
modulate the second optical signal;
combine the first optical signal and the second optical signal into a combined optical signal after modulating the first optical signal and the second optical signal, wherein combining the first optical signal and the second optical signals comprises directing the combined optical signal into a proof mass assembly, wherein an inner sidewall of a first beam structure of the proof mass assembly has a first inner spatial frequency corresponding to a second inner spatial frequency of an inner sidewall of a second beam structure of the proof mass assembly and wherein an outer sidewall of the first beam structure has a first outer spatial frequency corresponding to a second outer spatial frequency of an outer sidewall of the second beam structure;
generate a first electrical signal and a second electrical signal based on a response optical signal output from the proof mass assembly, wherein the response optical signal is generated in response to the combined optical signal;
wherein, to modulate the second optical signal, the circuit is configured to modulate the second optical signal based on the second electrical signal; and
wherein, to generate the first optical signal and the second optical signal, the circuit is configured to generate the first optical signal and the second optical signal to be laser locked to a frequency that is based on the first electrical signal.

* * * * *